US012615771B2

(12) United States Patent
Heo

(10) Patent No.: US 12,615,771 B2
(45) Date of Patent: Apr. 28, 2026

(54) METHOD OF MANUFACTURING SEMICONDUCTOR DEVICE

(71) Applicant: SK hynix Inc., Icheon-si (KR)

(72) Inventor: Min Young Heo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 693 days.

(21) Appl. No.: 17/953,009

(22) Filed: Sep. 26, 2022

(65) Prior Publication Data

US 2023/0020017 A1 Jan. 19, 2023

Related U.S. Application Data

(63) Continuation-in-part of application No. 17/090,735, filed on Nov. 5, 2020, now Pat. No. 11,456,311.

(30) Foreign Application Priority Data

Jun. 5, 2020 (KR) ........................ 10-2020-0068100

(51) Int. Cl.
| | |
|---|---|
| *H10B 43/30* | (2023.01) |
| *H10B 41/27* | (2023.01) |
| *H10B 41/30* | (2023.01) |
| *H10B 43/27* | (2023.01) |
| *H10B 63/00* | (2023.01) |

(52) U.S. Cl.
CPC ............. *H10B 43/27* (2023.02); *H10B 41/27* (2023.02); *H10B 41/30* (2023.02); *H10B 43/30* (2023.02); *H10B 63/84* (2023.02)

(58) Field of Classification Search
None
See application file for complete search history.

(56) References Cited

U.S. PATENT DOCUMENTS

| | | | |
|---|---|---|---|
| 9,741,737 | B1 | 8/2017 | Huang et al. |
| 10,720,445 | B1 | 7/2020 | Shimizu et al. |
| 2013/0115761 | A1 | 5/2013 | Kim et al. |
| 2015/0179662 | A1 | 6/2015 | Makala et al. |
| 2015/0249093 | A1 | 9/2015 | Lee et al. |

(Continued)

FOREIGN PATENT DOCUMENTS

| | | |
|---|---|---|
| CN | 103594423 A | 2/2014 |
| CN | 106328657 A | 1/2017 |

(Continued)

*Primary Examiner* — Sarah K Salerno
(74) *Attorney, Agent, or Firm* — WILLIAM PARK AND ASSOCIATES LTD.

(57) ABSTRACT

A method of manufacturing a semiconductor device includes forming a preliminary source structure including a source sacrificial layer and an upper source layer, forming a hole in the preliminary source structure, forming a preliminary memory layer on a surface of the hole, forming a channel layer on the preliminary memory layer, forming a trench passing through the upper source layer, forming a first buffer pattern by performing a surface treatment on a side portion of the upper source layer exposed by the trench, forming a cavity exposing a portion of the preliminary memory layer by removing the source sacrificial layer, forming an expanded cavity exposing a portion of the channel layer by removing the portion of the preliminary memory layer, and forming a source layer in the expanded cavity.

5 Claims, 38 Drawing Sheets

(56)     References Cited

U.S. PATENT DOCUMENTS

| | | | |
|---|---|---|---|
| 2016/0148947 A1 | 5/2016 | Seo et al. | |
| 2016/0343729 A1 | 11/2016 | Shin et al. | |
| 2017/0186766 A1 | 6/2017 | Kitao et al. | |
| 2017/0271358 A1 | 9/2017 | Mori | |
| 2018/0006052 A1 | 1/2018 | Hwang | |
| 2018/0175053 A1 | 6/2018 | Park et al. | |
| 2019/0019806 A1 | 1/2019 | Kim | |
| 2020/0027835 A1 | 1/2020 | Hsu et al. | |
| 2021/0036109 A1* | 2/2021 | Kim .................... | H10D 64/252 |
| 2021/0233779 A1 | 7/2021 | Kang et al. | |
| 2021/0384209 A1* | 12/2021 | Heo ...................... | H10B 41/27 |

FOREIGN PATENT DOCUMENTS

| | | | |
|---|---|---|---|
| CN | 106856197 A | 6/2017 | |
| CN | 106856198 A | 6/2017 | |
| CN | 106992184 A | 7/2017 | |
| CN | 107968091 A | 4/2018 | |
| CN | 108140644 A | 6/2018 | |
| CN | 110600476 A | 12/2019 | |
| KR | 1020170035412 A | 3/2017 | |
| KR | 1020170112292 A | 10/2017 | |
| KR | 101807247 B1 | 12/2017 | |
| KR | 1020190058079 A | 5/2019 | |

* cited by examiner

FIG. 1A

METHOD OF MANUFACTURING SEMICONDUCTOR DEVICE

CROSS-REFERENCE TO RELATED APPLICATION

This application is a continuation-in-part of U.S. application Ser. No. 17/090,735, filed on Nov. 5, 2020, which claims priority under 35 U.S.C. § 119(a) to Korean Patent Application Number 10-2020-0068100 filed on Jun. 5, 2020 in the Korean Intellectual Property Office, the entire disclosure of which is incorporated by reference herein.

BACKGROUND

1. Technical Field

The present disclosure relates to a method of manufacturing a semiconductor device, and more particularly, to a method of manufacturing a three-dimensional semiconductor device.

2. Related Art

A semiconductor device includes an integrated circuit configured of a metal oxide semiconductor field effect transistor (MOSFET). As the size and design rule of the semiconductor device are gradually reduced, the scaling down of the MOSFETs is also gradually accelerating.

However, the size reduction of the MOSFETs may cause a short channel effect, or the like, resulting in a degradation of operation characteristics of the semiconductor device. Accordingly, various methods for forming a semiconductor device with better performance have been studied while overcoming the limitations due to high integration of the semiconductor device.

Furthermore, such an integrated circuit aims to increase the reliability of operations and to lower power consumption. Therefore, a method of manufacturing a device with higher reliability and lower power consumption in a smaller space is also being studied.

SUMMARY

A method of manufacturing a semiconductor device according to an embodiment of the present disclosure may include forming a preliminary source structure including a lower source layer, a first source protective layer, a source sacrificial layer, a second source protective layer and an upper source layer, forming a hole in the preliminary source structure, forming a preliminary memory layer on a surface of the hole, forming a channel layer on the preliminary memory layer, forming a trench passing through the upper source layer, forming a first buffer pattern by performing a surface treatment on a side portion of the upper source layer exposed by the trench, wherein a portion of the upper source layer remains between the first buffer and the preliminary memory layer, forming a cavity exposing a portion of the preliminary memory layer by removing the source sacrificial layer and the first and second protective layers, forming an expanded cavity exposing a portion of the channel layer by removing the portion of the preliminary memory layer, and forming a source layer in the expanded cavity.

A method of manufacturing a semiconductor device according to an embodiment of the present disclosure may include forming a preliminary source structure. The preliminary source structure may include a lower source layer, an upper source layer and a source sacrificial layer between the lower and upper source layers. The method may further include forming a hole in the preliminary source structure, forming a preliminary memory layer on a surface of the hole, forming a channel layer on the preliminary memory layer, forming a trench passing through an upper source layer, forming a first buffer pattern and a dummy pattern by performing a surface treatment on a side portion of the upper source layer and a portion of the source sacrificial layer that are exposed by the trench, wherein a remaining portion of the upper source layer is disposed between the first buffer and the preliminary memory layer, and wherein a remaining portion of the source sacrificial layer is disposed between the dummy pattern and the lower source layer, removing a portion of the dummy pattern to expose the remaining portion of the source sacrificial layer, forming a cavity exposing a portion of the preliminary memory layer by removing the remaining portion of the source sacrificial layer, forming an expanded cavity exposing a portion of the channel layer by removing the portion of the preliminary memory layer, and forming a source layer in the expanded cavity.

BRIEF DESCRIPTION OF THE DRAWINGS

FIG. 1A is a plan view of a semiconductor device according to an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as limited to the embodiments described in the present specification or application.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments of the present disclosure provide a semiconductor device and a method of manufacturing a semiconductor device that is capable of improving operation reliability.

Figure 1A:
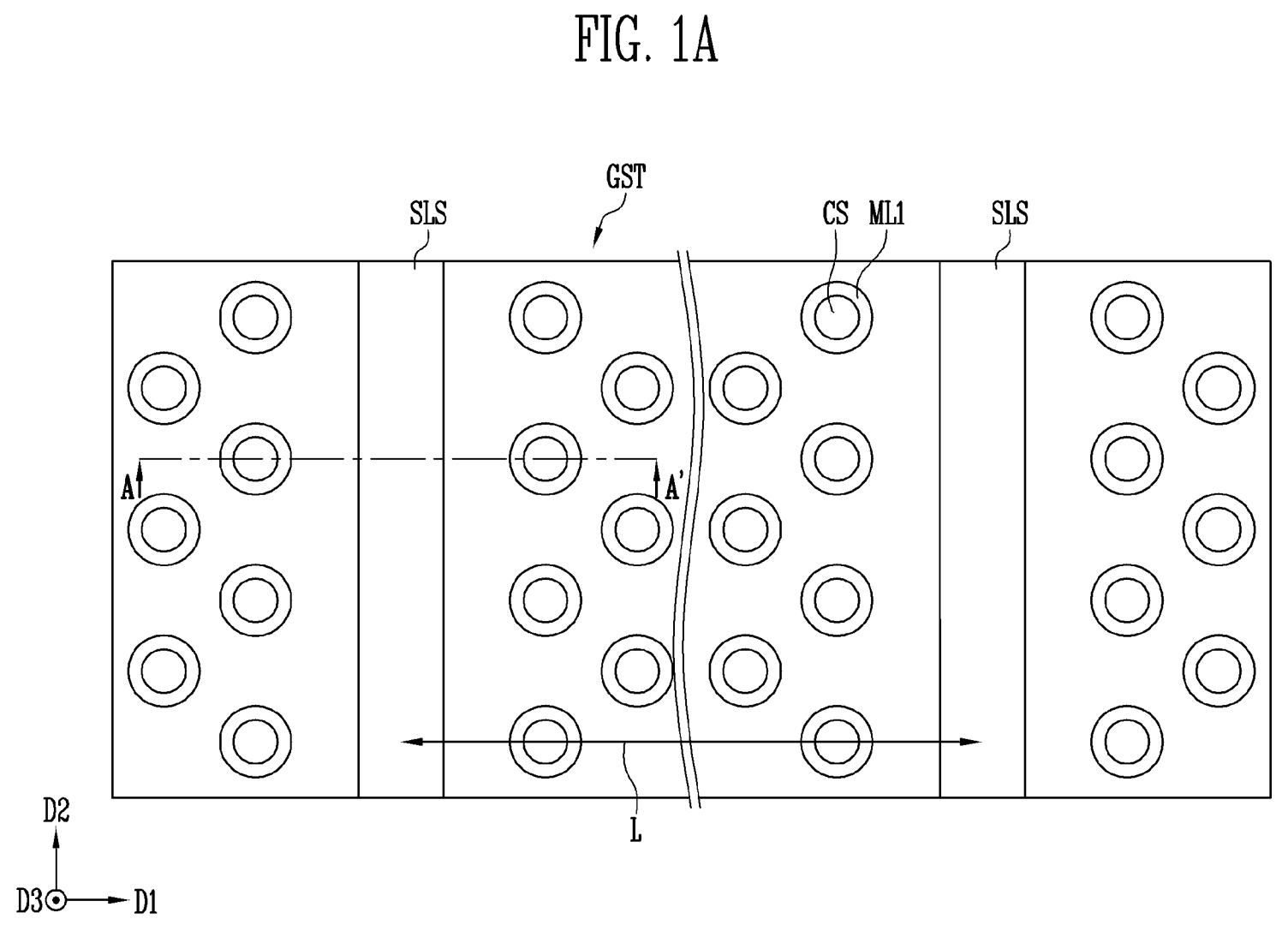
Figure 1B:
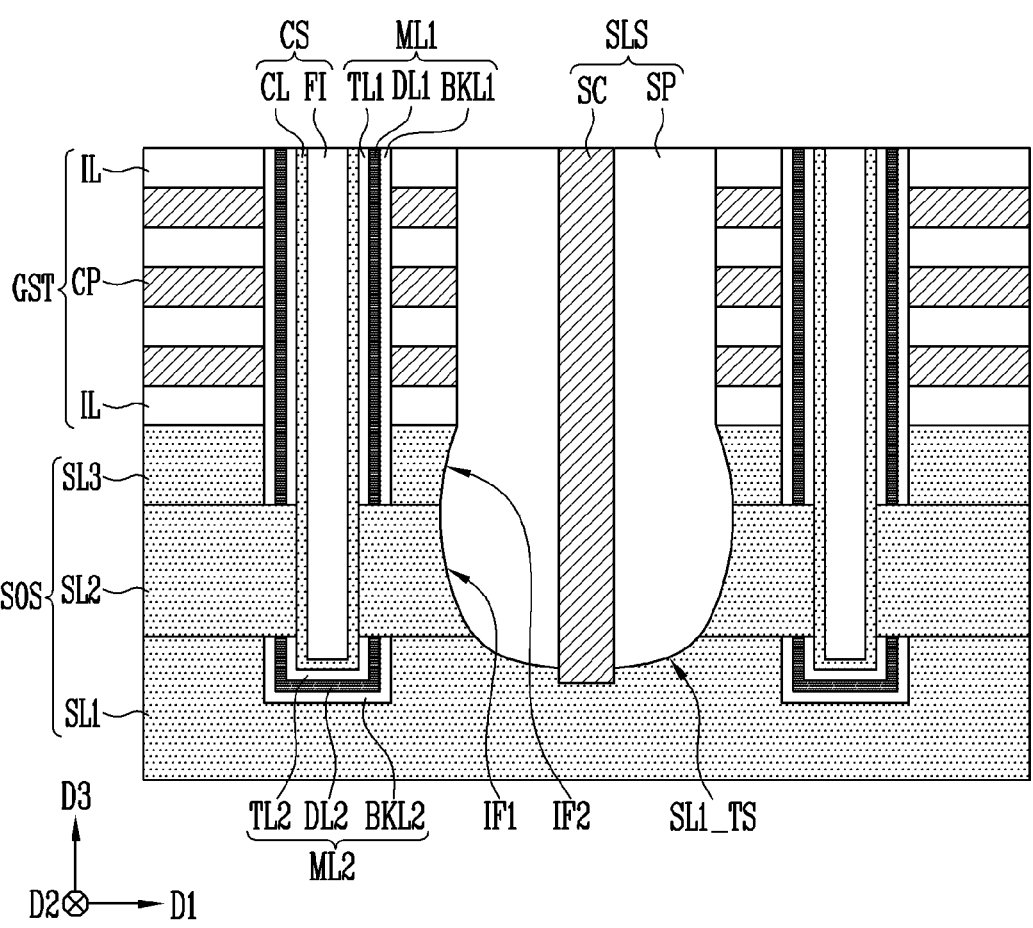
FIG. 1B is a cross-sectional view that is taken along a line A-A' of FIG. 1A.

FIG. 1A is a plan view of a semiconductor device according to an embodiment of the present disclosure. FIG. 1B is a cross-sectional view that is taken along a line A-A' of FIG. 1A.

Referring to FIGS. 1A and 1B, the semiconductor device may include a source structure SOS. The source structure SOS may have a shape of a plate, extending along a plane that is defined by a first direction D1 and a second direction D2. The first direction D1 and the second direction D2 may intersect each other. For example, the first direction D1 and the second direction D2 may be orthogonal to each other.

For example, the source structure SOS may be provided on a substrate that physically supports the source structure SOS. For example, the substrate may be a semiconductor substrate or an insulator substrate.

For example, a peripheral circuit structure with transistors and wires between the source structure SOS and the substrate may be provided.

The source structure SOS may include a first source layer SL1, a second source layer SL2, and a third source layer SL3. The first source layer SL1, the second source layer SL2, and the third source layer SL3 may be sequentially stacked in a third direction D3. The third direction D3 may intersect the first direction D1 and the second direction D2. For example, the third direction D3 may be orthogonal to the first direction D1 and the second direction D2.

The first source layer SL1, the second source layer SL2, and the third source layer SL3 may include the same material. The first source layer SL1, the second source layer SL2, and the third source layer SL3 may include a semiconductor material. For example, the first source layer SL1, the second source layer SL2, and the third source layer SL3 may include doped polysilicon.

A gate stack structure GST may be provided on the source structure SOS. The gate stack structure GST may include conductive patterns CP and insulating layers IL that are alternately stacked in the third direction D3. A lowermost insulating layer IL of the gate stack structure GST may be provided on the third source layer SL3 of the source structure SOS, and the conductive patterns CP and the insulating layers IL may be alternately stacked on the lowermost insulating layer IL.

The insulating layers IL may include an insulating material. For example, the insulating layers IL may include oxide. The conductive pattern CP may include a conductive layer. For example, the conductive layer may include at least one of a doped silicon layer, a metal silicide layer, tungsten, nickel, and cobalt. The conductive layer may be used as a word line connected to a memory cell or a select line connected to a select transistor. The conductive pattern CP may further include a barrier layer covering a surface of the conductive layer. The barrier layer may be formed between the conductive layer and the insulating layer IL. For example, the barrier layer may include at least one of titanium nitride and tantalum nitride.

Channel structures CS, passing through the gate stack structure GST, the third source layer SL3, and the second source layer SL2, may be provided. The channel structures CS may pass through the insulating layers IL and the conductive patterns CP of the gate stack structure GST. The channel structures CS may extend in the third direction D3. A lowermost portion of the channel structure CS may be provided in the first source layer SL1. The channel structure CS may be electrically connected to the second source layer SL2 of the source structure SOS.

Each of the channel structures CS may include a filling layer FI and a channel layer CL that surround the filling layer FI. The filling layer FI and the channel layer CL may pass through the gate stack structure GST, the third source layer SL3, and the second source layer SL2. The filling layer FI and the channel layer CL may extend in the third direction D3. The channel layer CL may contact the second source layer SL2. The channel layer CL may be electrically connected to the second source layer SL2 of the source structure SOS.

The filling layer FI may include an insulating material. For example, the filling layer FI may include oxide. The channel layer CL may include a semiconductor material. For example, the channel layer CL may include polysilicon.

A first memory layer ML1 and a second memory layer ML2 that surround the channel structure CS may be provided. The first memory layer ML1 may surround an upper portion and a middle portion of the channel structure CS. The second memory layer ML2 may surround a lower portion of the channel structure CS. The first memory layer ML1 may pass through the gate stack structure GST and the third source layer SL3. The second memory layer ML2 may be provided in the first source layer SL1.

The first and second memory layers ML1 and ML2 may be spaced apart from each other in the third direction D3. A portion of the second source layer SL2 may be provided between the first memory layer ML1 and the second memory layer ML2. The portion of the second source layer SL2 may contact the channel layer CL. The first and second memory layers ML1 and ML2 may be spaced apart from each other by the second source layer SL2.

The first memory layer ML1 may include a first tunnel insulating layer TL1 that surrounds an upper portion and a middle portion of the channel layer CL, a first data storage layer DL1 that surrounds the first tunnel insulating layer TL1, and a first blocking layer BKL1 that surrounds the first data storage layer DL1. The second memory layer ML2 may include a second tunnel insulating layer TL2 that surrounds a lower portion of the channel layer CL, a second data storage layer DL2 that surrounds the second tunnel insulating layer TL2, and a second blocking layer BKL2 that surrounds the second data storage layer DL2.

The first tunnel insulating layer TL1 and the second tunnel insulating layer TL2 may be spaced apart from each other in the third direction D3. A portion of the second source layer SL2 may be provided between the first tunnel insulating layer TL1 and the second tunnel insulating layer TL2. The first data storage layer DL1 and the second data storage layer DL2 may be spaced apart from each other in the third direction D3. A portion of the second source layer SL2 may be provided between the first data storage layer DL1 and the second data storage layer DL2. The first blocking layer BKL1 and the second blocking layer BKL2 may be spaced apart from each other in the third direction D3. A portion of the second source layer SL2 may be provided between the first blocking layer BKL1 and the second blocking layer BKL2.

The first and second tunnel insulating layers TL1 and TL2 may include a material that is capable of charge tunneling. For example, the first and second tunnel insulating layers TL1 and TL2 may include oxide. For example, the first and second data storage layers DL1 and DL2 may include nitride to which charges may be trapped. A material that is included in the first and second data storage layers DL1 and DL2 is not limited to nitride and may be variously modified based on a data storage method. For example, the first and second data storage layers DL1 and DL2 may include silicon, a phase change material, or nanodot. The first and second blocking layers BKL1 and BKL2 may include a material that is capable of blocking the movement of a charge. For example, the first and second blocking layers BKL1 and BKL2 may include oxide.

A slit structure SLS, passing through the gate stack structure GST, the third source layer SL3, and the second source layer SL2, may be provided. The slit structure SLS may extend in the second direction D2 and the third direction D3. The slit structure SLS may extend in the third direction D3 and may pass through the gate stack structure GST, the third source layer SL3, and the second source layer SL2. The lowermost portion of the slit structure SLS may be disposed in the first source layer SL1.

The slit structure SLS may include spacers SP and a source contact SC. The spacers SP may be disposed on both sides of the source contact SC. The spacers SP and the source contact SC may extend in the second direction D2 and the third direction D3. The spacers SP and the source contact SC may extend in the third direction D3 and may pass through the gate stack structure GST, the third source layer SL3, and the second source layer SL2.

The spacers SP may be spaced apart from each other in the first direction D1 with the source contact SC positioned therebetween. The source contact SC may be spaced apart from the gate stack structure GST, the third source layer SL3, and the second source layer SL2 by the spacers SR The source contact SC may contact the first source layer SL1 of the source structure SOS. The lowermost portion of the source contact SC may be disposed in the first source layer SL1. The source contact SC may be electrically connected to the first source layer SL1 of the source structure SOS. The source contact SC may be electrically separated from the conductive pattern CP by the spacer SP.

The spacer SP may include an insulating material. For example, the spacer SP may include oxide. The source contact SC may include a conductive material. For example, the source contact SC may include at least one of polysilicon and tungsten.

The spacer SP may contact a portion of an upper surface SL1_TS of the first source layer SL1. The portion of the upper surface SL1_TS may be exposed by the second source layer SL2. In other words, the portion of the upper surface SL1_TS may not be covered with the second source layer SL2. The spacer SP may contact a sidewall of the second source layer SL2 and a sidewall of the third source layer SL3. The spacer SP may extend along a sidewall of the gate stack structure GST.

A sidewall of the source structure SOS facing the spacer SP may be concave toward the channel layer CL. In an embodiment, a first interface IF1 and a second interface IF2 may be defined along the sidewall of the source structure SOS. The first interface IF1 may be defined between the second source layer SL2 and the spacer SP, and the second interface IF2 may be defined between the third source layer SL3 and the spacer SP. Each of the first and second interfaces IF1 and IF2 may have shape corresponding the concave sidewall of the source structure SOS. In an embodiment, the first interface IF1 may be further away from the channel layer CL as the first interface IF1 is closer to the first source layer SL1. In an embodiment, the second interface IF2 may be further away from the channel layer CL as the second interface IF2 is closer to the gate stack structure GST. Each of the first and second interfaces IF1 and IF2 may have a round shape.

The portion of the upper surface SL1_TS of the first source layer SL1 may have a round concave shape. The spacer SP and the source contact SC may contact the portion of the upper surface SL1_TS of the first source layer SL1. The source contact SC may extend along a sidewall of the spacer SP. The spacer SP may be interposed between the source contact SC and the gate stack structure GST.

The semiconductor device may have a width that is relatively small in the first direction D1 of the slit structure SLS. Accordingly, a distance L in the first direction D1 between the centers of two slit structures SLS that are adjacent to each other may be relatively small, and the degree of integration of the semiconductor device may be improved.

FIGS. 2A to 2M are cross-sectional views illustrating a method of manufacturing the semiconductor device according to FIGS. 1A and 1B.

For brevity of description, the same reference numerals are used for the components that are described with reference to FIGS. 1A and 1B, and repetitive description will be omitted.

The manufacturing method, described below, is merely one embodiment of the method of manufacturing the semiconductor memory device according to FIGS. 1A and 1B, and the method of manufacturing the semiconductor memory device, according to FIGS. 1A and 1B, is not limited to the manufacturing method described below.

Figure 2A:
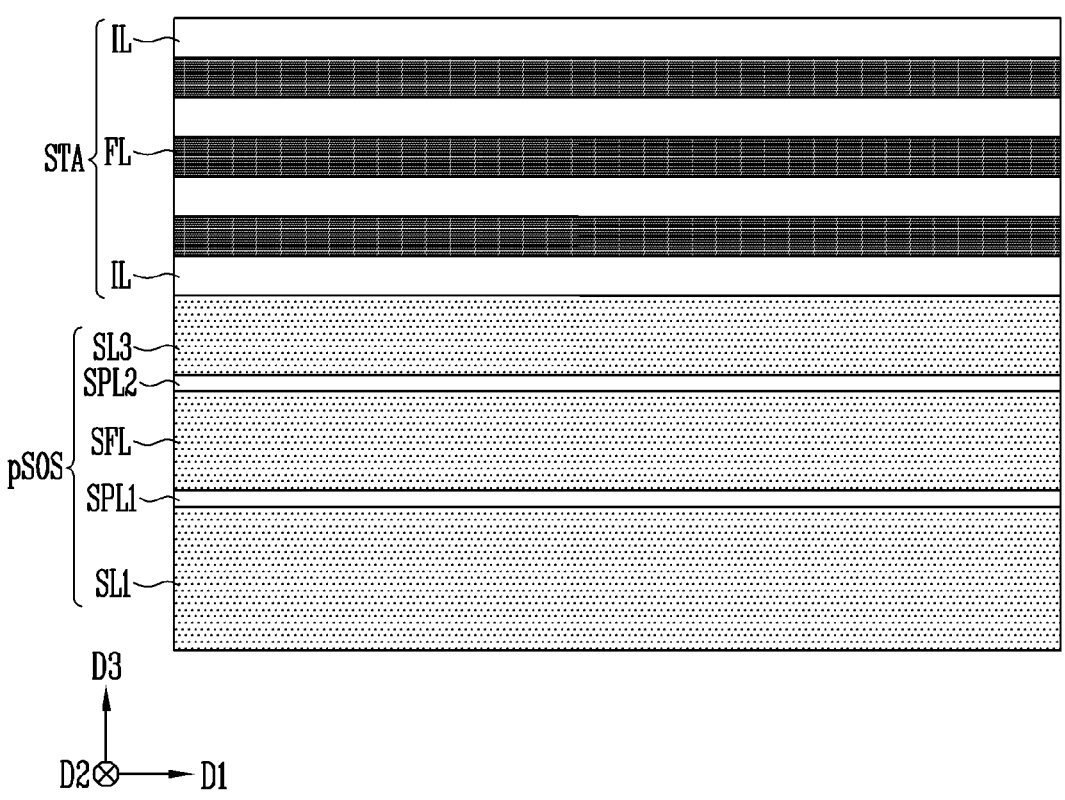
FIGS. 2A to 2M are cross-sectional views illustrating a method of manufacturing the semiconductor device according to on FIGS. 1A and 1B.

Referring to FIG. 2A, a preliminary source structure pSOS may be formed. The preliminary source structure pSOS may include a first source layer SL1, a first source protective layer SPL1, a source sacrificial layer SFL, a second source protective layer SPL2, and the third source layer SL3, which are sequentially stacked in the third direction D3. The first source layer SL1, the first source protective layer SPL1, the source sacrificial layer SFL, the second source protective layer SPL2, and the third source layer SL3 may be sequentially formed to form the preliminary source structure pSOS. The first and second source protective layers SPL1 and SPL2 may be disposed between the first and third source layers SL1 and SL3, and the source sacrificial layer SFL may be disposed between the first and second source protective layers SPL1 and SPL2. At least one of the first source protective layer SPL1 and the second source protective layer SPL2 may be omitted.

The source sacrificial layer SFL may be formed of various materials having an etching selectivity with respective to oxide. In an embodiment, the source sacrificial layer SFL may include at least one of semiconductor material and nitride.

In an embodiment, the source sacrificial layer SFL may include a semiconductor material. For example, the source sacrificial layer SFL may include polysilicon.

The first and second source protective layers SPL1 and SPL2 may include a material with an etching selectivity with respect to the first and third source layers SL1 and SL3 and the source sacrificial layer SFL. For example, the first and second source protective layers SPL1 and SPL2 may include oxide.

The stack structure STA may be formed over the preliminary source structure pSOS. The stack structure STA may include insulating layers IL and sacrificial layers FL. The insulating layers IL may be defined as first material layers. The sacrificial layers FL may be defined as second material layers. The insulating layers IL and the sacrificial layers FL may be alternately stacked in the third direction D3. The stack structure STA may be formed by forming the lowermost insulating layer IL of the stack structure STA on the preliminary source structure pSOS and alternately forming the sacrificial layers FL and the insulating layers IL on the lowermost insulating layer IL. The sacrificial layers FL may include a material that is different from that of the insulating layers IL. In an embodiment, the sacrificial layers FL include a material having an etching selectivity with respect to the insulating layers IL. For example, the sacrificial layers FL may include nitride.

Figure 2B:
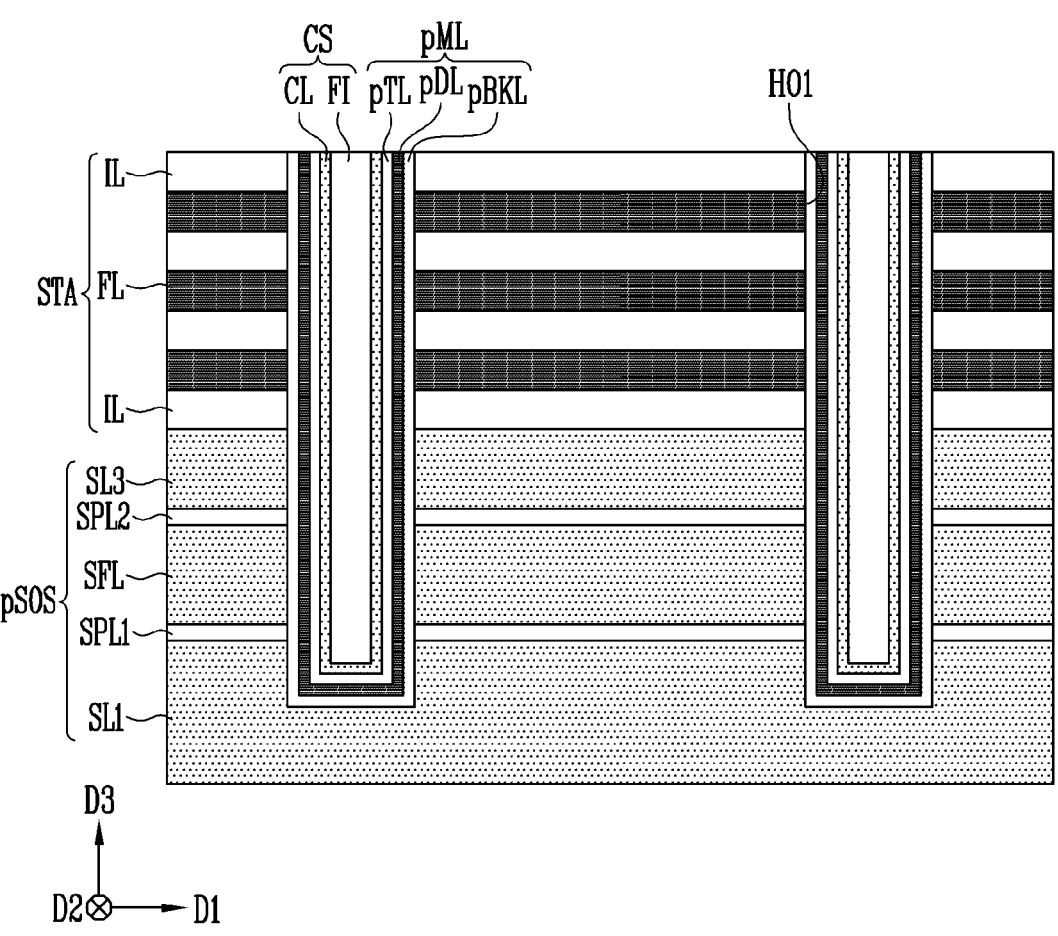

Referring to FIG. 2B, the channel structures CS and preliminary memory layers pML may be formed. The channel structure CS may pass through the stack structure STA, the third source layer SL3, the second source protective layer SPL2, the source sacrificial layer SFL, and the first source protective layer SPL1. The channel structure CS may extend in the third direction D3. The lowermost portion of the channel structure CS may be disposed in the first source layer SL1. The preliminary memory layer pML may surround the channel structure CS. The preliminary memory layer pML may pass through the stack structure STA, the third source layer SL3, the second source protective layer SPL2, the source sacrificial layer SFL, and the first source protective layer SPL1. The preliminary memory layer pML may extend in the third direction D3. The lowermost portion of the preliminary memory layer pML may be disposed in the first source layer SL1.

The channel structure CS may include the channel layer CL and the filling layer FI in the channel layer CL. The preliminary memory layer pML may include a preliminary tunnel insulating layer pTL that surrounds the channel structure CS, a preliminary data storage layer pDL that surrounds the preliminary tunnel insulating layer pTL, and a preliminary blocking layer pBKL that surrounds the preliminary data storage layer pDL.

The forming of the channel structure CS and the preliminary memory layer pML may include forming a first hole HO1 that passes through the stack structure STA, the third source layer SL3, the second source protective layer SPL2, the source sacrificial layer SFL, and the first source protective layer SPL1, and sequentially forming the preliminary blocking layer pBKL, the preliminary data storage layer pDL, the preliminary tunnel insulating layer pTL, the channel layer CL, and the filling layer FI in the first hole HO1.

The preliminary tunnel insulating layer pTL may include a material that is capable of charge tunneling. The preliminary data storage layer pDL may include a material to which a charge may be trapped. The preliminary blocking layer pBKL may include a material that is capable of blocking a movement of a charge.

Figure 2C:
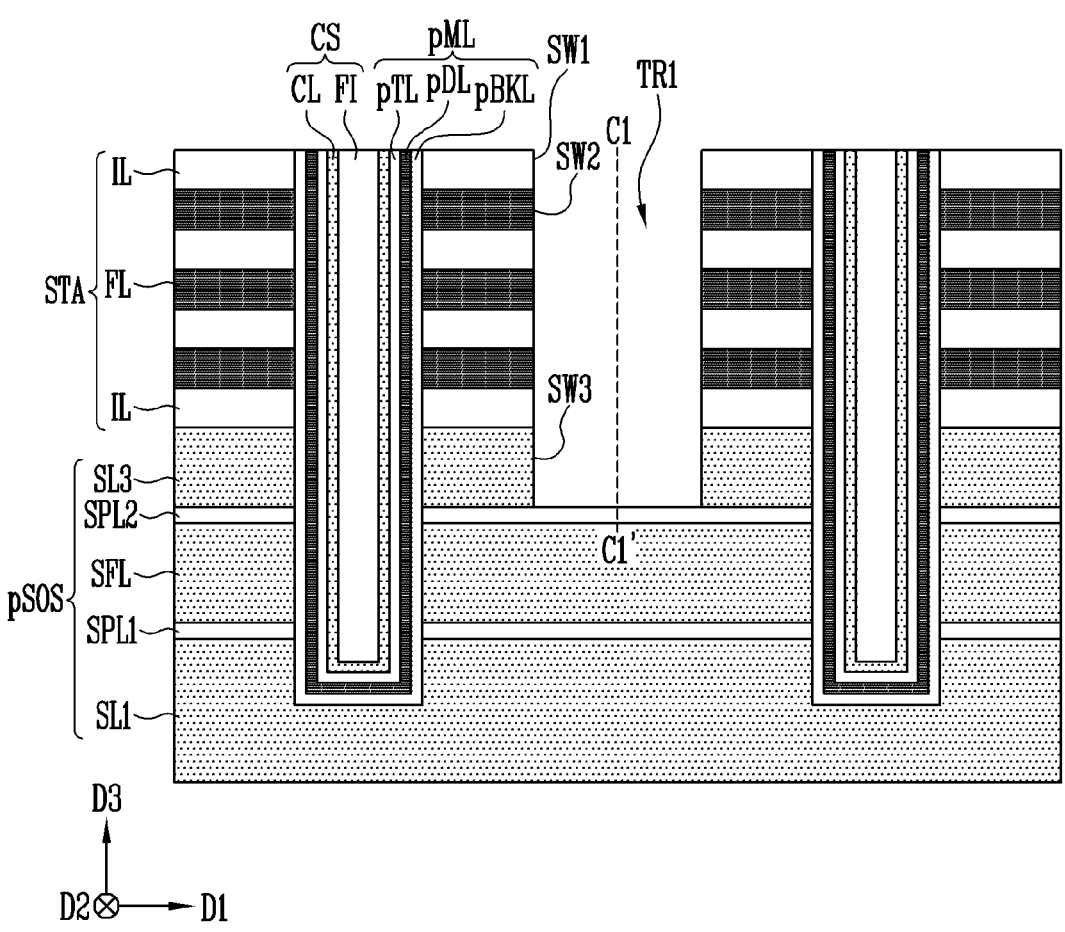

Referring to FIG. 2C, a first trench TR1 that passes through the stack structure STA and the third source layer SL3 may be formed. The first trench TR1 may extend in the second direction D2 and the third direction D3. The first trench TR1 may be formed between the channel structures CS.

The insulating layers IL, the sacrificial layers FL, and the third source layer SL3 may be exposed based on the formation of the first trench TR1. The sidewalls of the insulating layers IL that are exposed based on the formation of the first trench TR1 may be defined as first sidewalls SW1. The sidewalls of the sacrificial layers FL that are exposed based on the formation of the first trench TR1 may be defined as second sidewalls SW2. A sidewall of the third source layer SL3 that is exposed based on the formation of the first trench TR1 may be defined as a third sidewall SW3. An upper surface of the second source protective layer SPL2 may be exposed because the first trench TR1 is formed. The first trench TR1 may be defined by the first sidewalls SW1 of the insulating layers IL, the second sidewalls SW2 of the sacrificial layers FL, the third sidewall SW3 of the third source layer SL3, and the upper surface of the second source protective layer SPL2.

The center of the first trench TR1 may be defined by a first center line C1-C1'. The first center line C1-C1' may be a virtual line that delineates the center of the first trench TR1 in the first direction D1. In other words, the first center line C1-C1' may indicate the center of the first trench TR1 in the first direction D1.

Figure 2D:
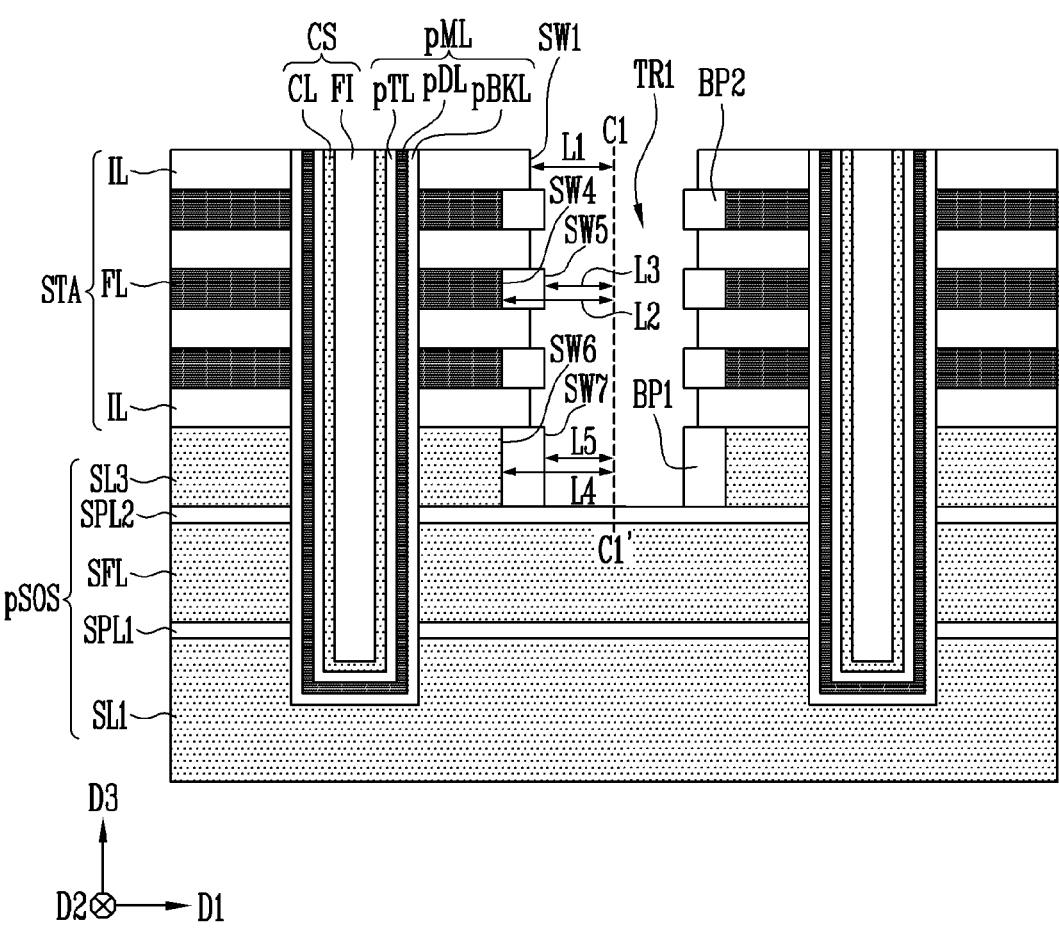

Referring to FIG. 2D, a surface treatment may be performed on the sacrificial layers FL and the third source layer SL3 that are exposed by the first trench TR1. A surface treatment may be performed on the second material layers of the stack structure STA. For example, the surface treatment may be an oxidation process, and the portions of the sacrificial layers FL and the third source layer SL3 that are exposed after the formation of the first trench TR1 may be oxidized. A surface treatment may be performed on a portion of the third source layer SL3 that is exposed by the first trench TR1 to form a first buffer pattern BP1. A surface treatment may be performed on a portion that is adjacent to the third sidewall SW3 (refer to FIG. 2C) of the third source layer SL3 to form the first buffer pattern BP1. A surface treatment may be performed on a portion of the third source layer SL3, and thus, the portion of the third source layer SL3 may become the first buffer pattern BP1.

The changed portion of the third source layer SL3 may extend to the center of the first trench TR1 while changing into the first buffer pattern BP1 by performing the surface treatment on the portion of the third source layer SL3. A portion of the first buffer pattern BP1 may be disposed between the insulating layer IL and the second source protective layer SPL2. A lower surface of the first buffer pattern BP1 may contact an upper surface of the second source protective layer SPL2, and an upper surface of the first buffer pattern BP1 may contact a lower surface of the insulating layer IL. The first buffer pattern BP1 may include the same material as the insulating layer IL. For example, the first buffer patterns BP1 may include oxide.

A surface treatment may be performed on a portion of the sacrificial layer FL that is exposed by the first trench TR1 to form a second buffer pattern BP2. A surface treatment may be performed on a portion that is adjacent to the second sidewall SW2 (refer to FIG. 2C) of the sacrificial layer FL to form the second buffer pattern BP2. A portion of the sacrificial layer FL may be changed into the second buffer pattern BP2. The second buffer patterns BP2 may be disposed between the insulating layers IL. The second buffer patterns BP2 may overlap the insulating layers IL. For example, the second buffer patterns BP2 may vertically overlap the insulating layers IL.

The changed portion of the sacrificial layer FL may extend to the center of the first trench TR1 while changing into the second buffer pattern BP2 by performing the surface treatment on the portion of the sacrificial layer FL. A portion of the second buffer pattern BP2 may be disposed between the insulating layers IL. The portion of the second buffer pattern BP2 may overlap the insulating layers IL. For example, the portion of the second buffer pattern BP2 may vertically overlap the insulating layers IL. A lower surface of the second buffer pattern BP2 may contact an upper surface of the insulating layer IL. An upper surface of the second buffer pattern BP2 may contact the lower surface of the insulating layer IL. The second buffer pattern BP2 may include the same material as the insulating layer IL. For example, the second buffer patterns BP2 may include oxide.

A sidewall of the sacrificial layer FL that contacts the second buffer pattern BP2 may be defined as a fourth sidewall SW4, and a sidewall of the second buffer pattern BP2 that is adjacent to a first center line C1-C1' may be defined as a fifth sidewall SW5. A sidewall of the third source layer SL3 that contacts the first buffer pattern BP1 may be defined as a sixth sidewall SW6, and a sidewall of the first buffer pattern BP1 that is adjacent to the first center line C1-C1' may be defined as a seventh sidewall SW7.

The distance between the first sidewall SW1 of the insulating layer IL and the first center line C1-C1' may be defined as a first distance L1. The distance between the fourth sidewall SW4 of the sacrificial layer FL and the first center line C1-C1' may be defined as a second distance L2. The distance between the fifth sidewall SW5 of the second buffer pattern BP2 and the first center line C1-C1' may be defined as a third distance L3. The distance between the sixth sidewall SW6 of the third source layer SL3 and the first center line C1-C1' may be defined as a fourth distance L4. The distance between the seventh sidewall SW7 of the first buffer pattern BP1 and the first center line C1-C1' may be defined as a fifth distance L5.

The third distance L3 and the fifth distance L5 may be less than the first distance L1. In other words, the shortest distance between the first buffer pattern BP1 and the center of the first trench TR1 and the shortest distance between the second buffer pattern BP2 and the center of the first trench TR1 may be less than the shortest distance between the insulating layer IL and the center of the first trench TR1.

The second distance L2 and the fourth distance L4 may be greater than the first distance L1. In other words, the shortest distance between the sacrificial layer FL and the center of the first trench TR1 and the shortest distance between the third source layer SL3 and the center of the first trench TR1 may be greater than the shortest distance between the insulating layer IL and the center of the first trench TR1.

Figure 2E:
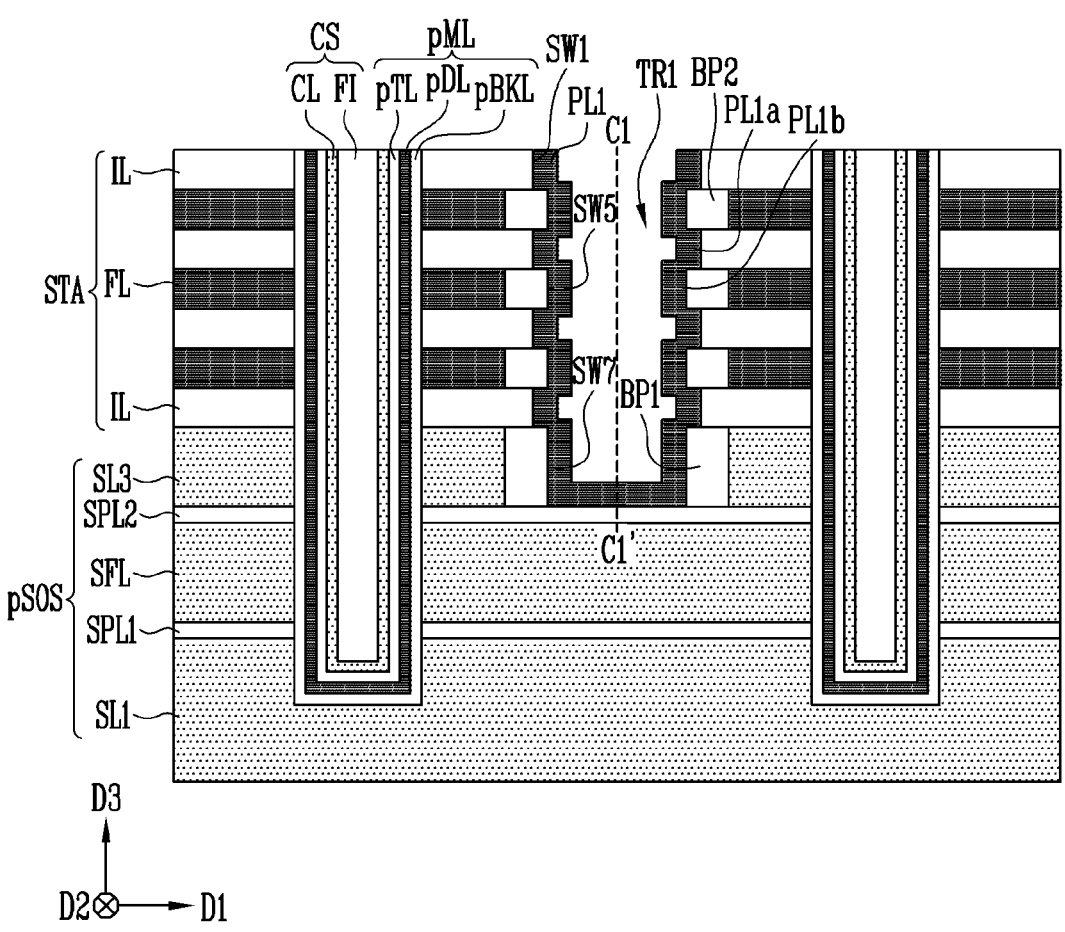

Referring to FIG. 2E, a first protective layer PL1 may be formed in the first trench TR1. The first protective layer PL1 may cover the insulating layers IL, the first buffer patterns BP1, the second buffer patterns BP2, and the second source protective layer SPL2. The first protective layer PL1 may cover the first sidewalls SW1 of the insulating layers IL, the seventh sidewalls SW7 of the first buffer patterns BP1, the fifth sidewalls SW5 of the second buffer patterns BP2, and the upper surface of the second source protective layer SPL2.

The first protective layer PL1 may be conformally formed on the first sidewalls SW1 of the insulating layers IL, the seventh sidewalls SW7 of the first buffer patterns BP1, and the fifth sidewalls SW5 of the second buffer patterns BP2, and thus, an inner sidewall of the first protective layer PL1 may include a portion that is relatively close to the first center line C1-C1' and a portion that is relatively distant from the first center line C1-C1'. In other words, a distance between the inner sidewall of the first protective layer PL1 and the first center line C1-C1' might not be uniform.

The first protective layer PL1 may include an interposed portion PL1a and a recess PL1b. The interposed portion PL1a of the first protective layer PL1 may be disposed between the second buffer patterns BP2. An upper surface of the interposed portion PL1a of the first protective layer PL1 may contact the lower surface of the second buffer pattern BP2. A lower surface of the interposed portion PL1a of the first protective layer PL1 may contact the upper surface of the second buffer pattern BP2. The recess PL1b of the first protective layer PL1 may be formed by recessing the inner sidewall of the first protective layer PL1 toward the interposed portion PL1a of the first protective layer PL1 and the insulating layer IL. The recess PL1b of the first protective layer PL1 may be formed at the same level as the interposed portion PL1a of the first protective layer PL1 and the insulating layer IL.

The first protective layer PL1 may be a single layer. In other words, the first protective layer PL1 may be configured of one material. The first protective layer PL1 may include a material that may be etched simultaneously with the preliminary data storage layer pDL. For example, the first protective layer PL1 may include the same material as the preliminary data storage layer pDL. For example, the first protective layer PL1 may include nitride.

Figure 2F:
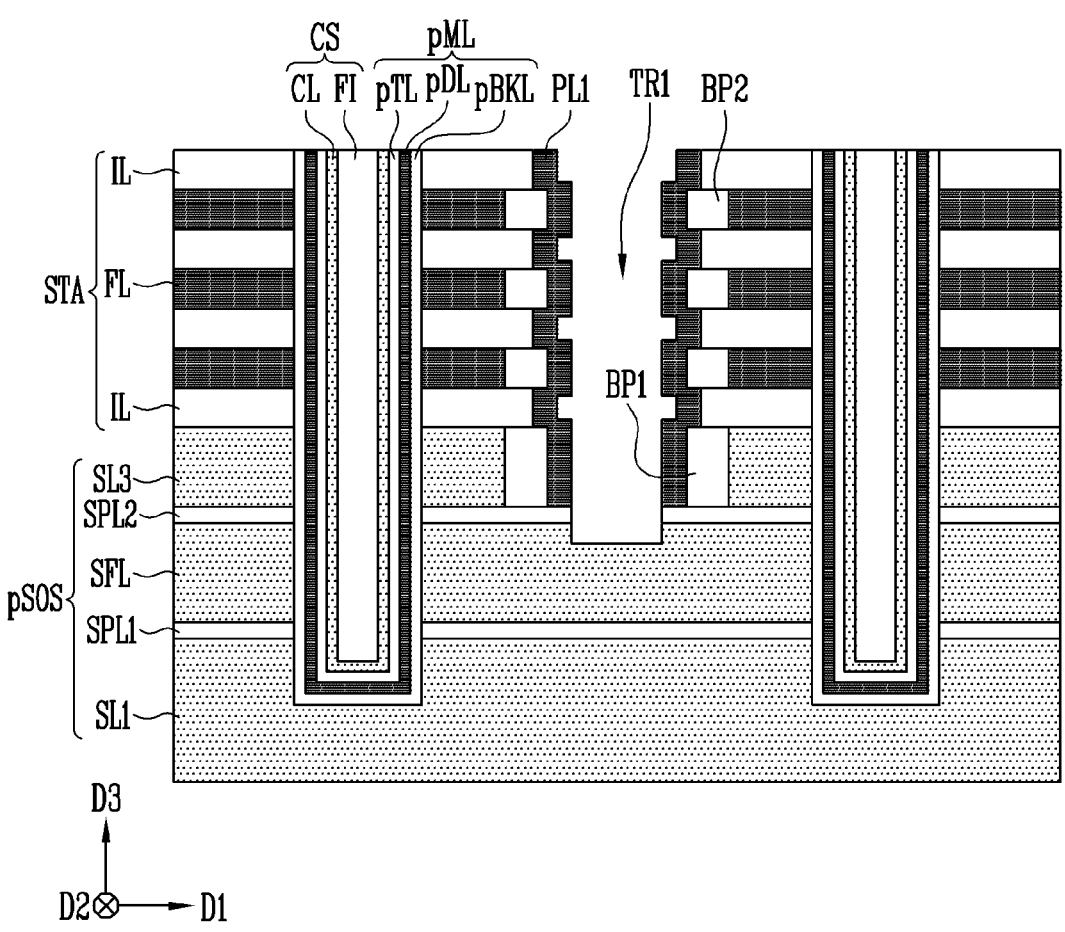

Referring to FIG. 2F, a portion of a lower portion of the first protective layer PL1, a portion of the second source protective layer SPL2, and a portion of the source sacrificial layer SFL may be removed through the first trench TR1. Accordingly, the first trench TR1 may be expanded. The first trench TR1 may be expanded and may pass through the second source protective layer SPL2.

The first trench TR1 may be expanded, and a lowermost portion of the first trench TR1 may be disposed in the source sacrificial layer SFL. The source sacrificial layer SFL may be exposed by the first trench TR1. While the first trench TR1 is expanded, the first protective layer PL1 may protect the first buffer patterns BP1, the second buffer patterns BP2, and the insulating layer IL.

Figure 2G:
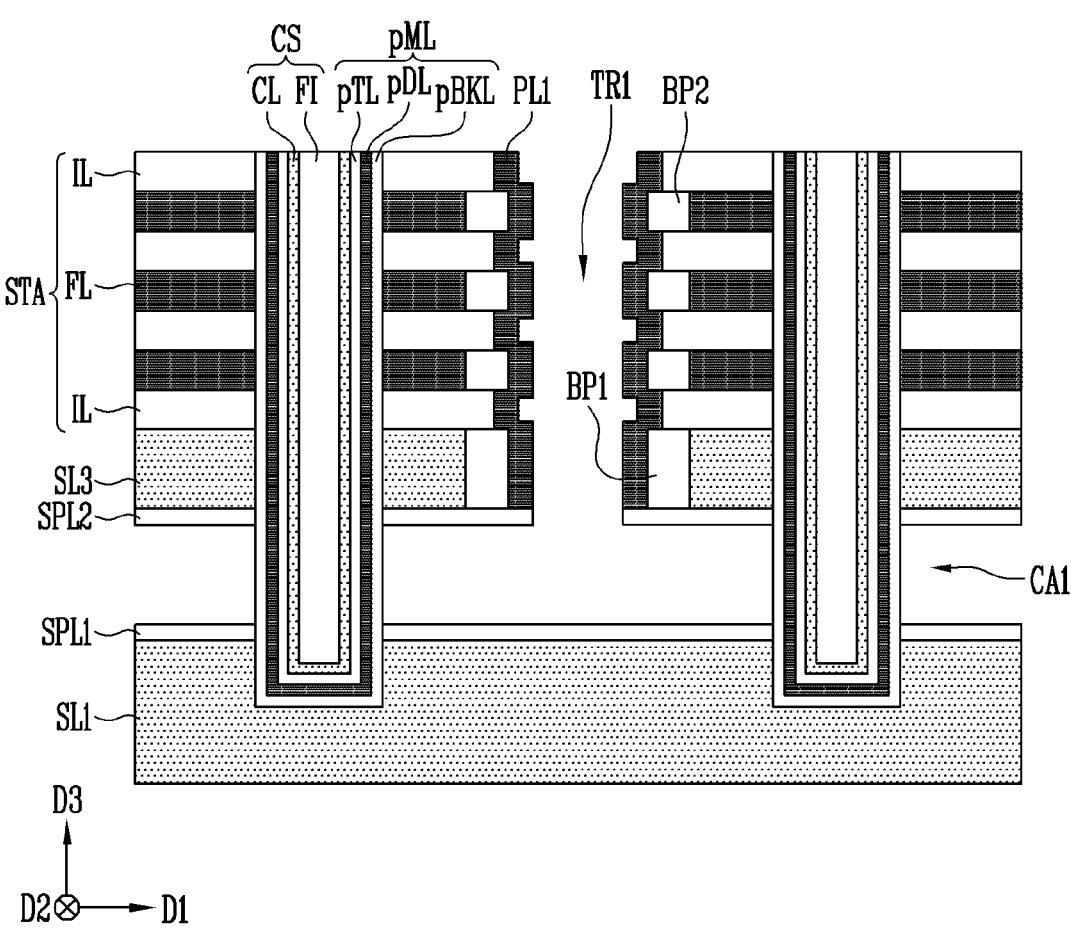

Referring to FIG. 2G, the source sacrificial layer SFL (refer to FIG. 2F) may be removed. The removing of the source sacrificial layer SFL may include inserting a material that is capable of etching the source sacrificial layer SFL through the first trench TR1. While the source sacrificial layer SFL is being removed, the first protective layer PL1 may protect the first buffer patterns BP1, the second buffer patterns BP2, and the insulating layer IL. While the source sacrificial layer SFL is being removed, the first and second source protective layers SPL1 and SPL2 might not be etched.

The source sacrificial layer SFL may be removed, and thus, a first cavity CA1 may be formed. An empty space that is formed by removing the source sacrificial layer SFL may be defined as the first cavity CA1. The first cavity CA1 may be an empty space between the first and second source protective layers SPL1 and SPL2.

The source sacrificial layer SFL, which is a portion of the preliminary source structure pSOS, may be removed, and thus, a portion of the preliminary blocking layer pBKL of the preliminary memory layer pML may be exposed. The source sacrificial layer SFL may be removed, and thus, an upper surface of the first source protective layer SPL1 and a lower surface of the second source protective layer SPL2 may be exposed.

Figure 2H:
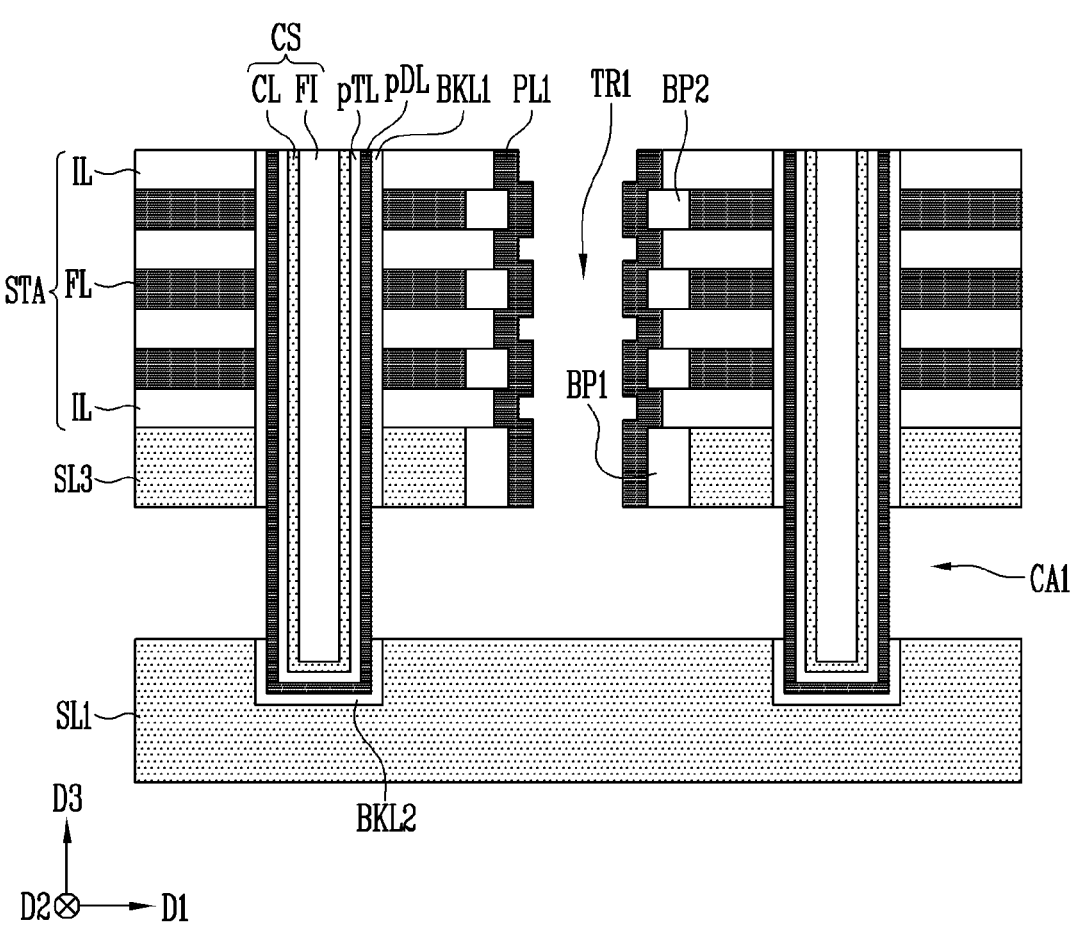

Referring to FIG. 2H, the portion of the preliminary blocking layer pBKL (refer to FIG. 2G) that is exposed by the first cavity CA1 may be removed. The portion of the preliminary blocking layer pBKL may be removed, and thus, the preliminary blocking layer pBKL may be divided into a first blocking layer BKL1 and a second blocking layer BKL2. The first blocking layer BKL1 and the second blocking layer BKL2 may be spaced apart from each other in the third direction D3. The portion of the preliminary blocking layer pBKL may be removed, and thus, the first cavity CA1 may be expanded, and a portion of the preliminary data storage layer pDL may be exposed.

The first and second source protective layers SPL1 and SPL2 (refer to FIG. 2G) may be removed while removing the portion of the preliminary blocking layer pBKL or through a separate process. For example, when the portion of the preliminary blocking layer pBKL and the first and second source protective layers SPL1 and SPL2 are simultaneously removed, the portion of the preliminary blocking layer pBKL and the first and second source protective layers SPL1 and SPL2 may be simultaneously removed by a first etching material that is inserted into the first trench TR1 and the first cavity CA1. The first etching material may be a material that is capable of etching the preliminary blocking layer pBKL and the first and second source protective layers SPL1 and SPL2.

While the portion of the preliminary blocking layer pBKL and the first and second source protective layers SPL1 and SPL2 are being removed, the first protective layer PL1 may protect the first buffer patterns BP1, the second buffer patterns BP2, and the insulating layer IL.

Figure 2I:
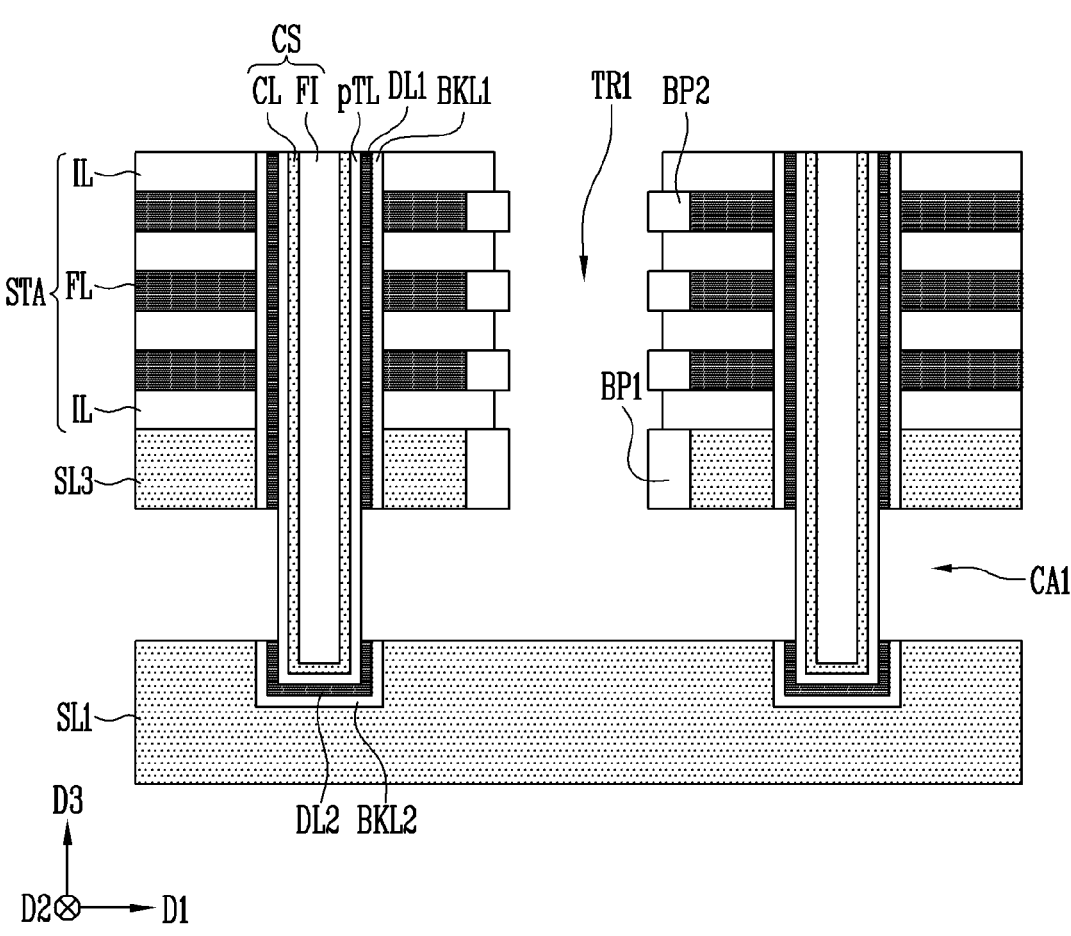

Referring to FIG. 2I, the portion of the preliminary data storage layer pDL (refer to FIG. 2H) that is exposed by the first cavity CA1 may be removed. The portion of the preliminary data storage layer pDL may be removed, and thus, the preliminary data storage layer pDL may be divided into a first data storage layer DL1 and a second data storage layer DL2. The first data storage layer DL1 and the second data storage layer DL2 may be spaced apart from each other in the third direction D3. The portion of the preliminary data storage layer pDL may be removed, and thus, the first cavity CA1 may be expanded and a portion of the preliminary tunnel insulating layer pTL may be exposed.

The first protective layer PL1 (refer to FIG. 2H) may be removed while removing the portion of the preliminary data storage layer pDL or through a separate process. For example, when the portion of the preliminary data storage layer pDL and the first protective layer PL1 are simultaneously removed, the portion of the preliminary data storage layer pDL and the first protective layer PL1 may be simultaneously removed by a second etching material that is inserted into the first trench TR1 and the first cavity CA1. The second etching material may be a material that is capable of etching the preliminary data storage layer pDL and the first protective layer PL1. The first protective layer PL1 may be removed, and thus, the insulating layers IL, the first buffer patterns BP1, and the second buffer patterns BP2 may be exposed.

Figure 2J:
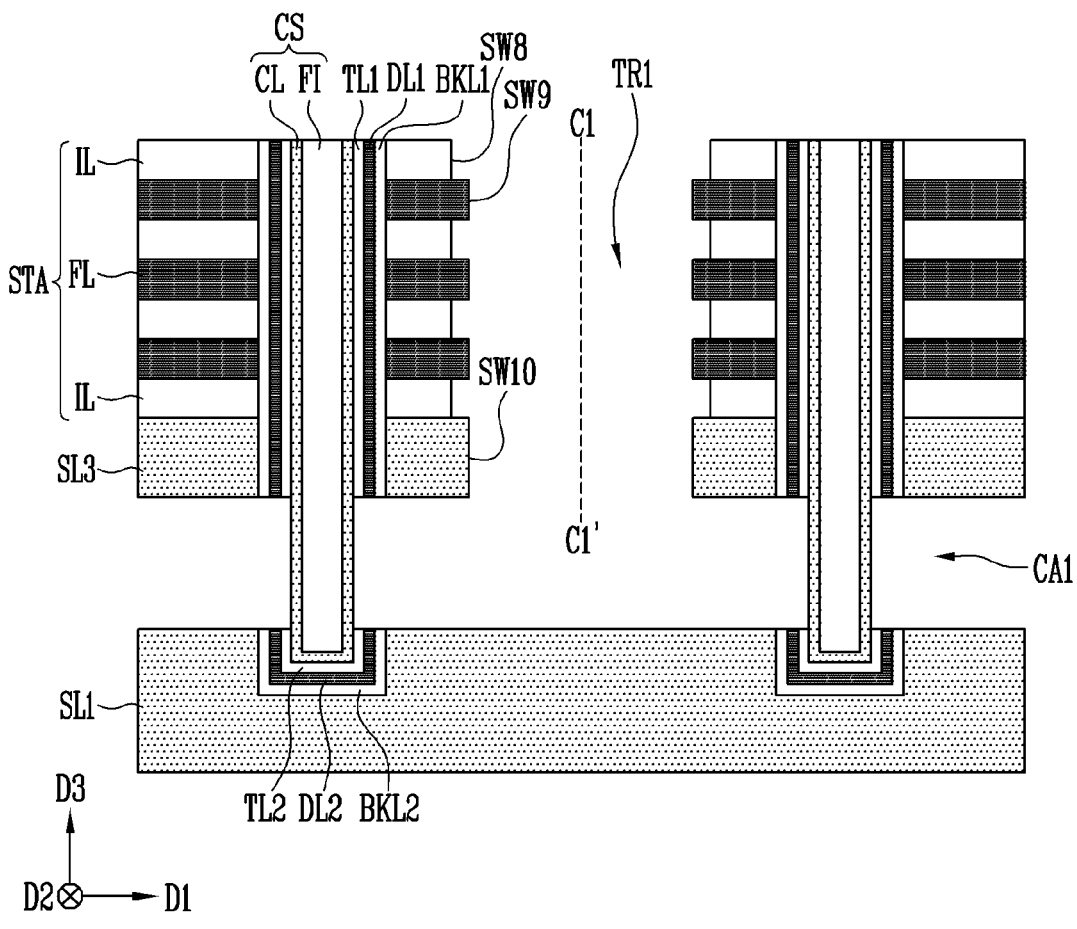

Referring to FIG. 2J, the portion of the preliminary tunnel insulating layer pTL (refer to FIG. 2I) that is exposed by the first cavity CA1 may be removed. The portion of the preliminary tunnel insulating layer pTL may be removed, and thus, the preliminary tunnel insulating layer pTL may be divided into a first tunnel insulating layer TL1 and a second tunnel insulating layer TL2. The first tunnel insulating layer TL1 and the second tunnel insulating layer TL2 may be spaced apart from each other in the third direction D3. The portion of the preliminary tunnel insulating layer pTL may be removed, and thus, the first cavity CA1 may be expanded, and a portion of the channel layer CL may be exposed.

The first buffer pattern BP1, the second buffer pattern BP2, and a portion the insulating layer IL may be removed while removing the portion of the preliminary tunnel insulating layer pTL. For example, the portion of the preliminary tunnel insulating layer pTL, the first buffer pattern BP1, the second buffer pattern BP2, and the portion of the insulating layer IL may be removed by a third etching material that is inserted into the first trench TR1 and the first capacity CA1. The third etching material may include a material that is capable of etching the preliminary tunnel insulating layer pTL, the first buffer pattern BP1, the second buffer pattern BP2, and the insulating layer IL.

The first buffer pattern BP1 may be removed, and thus, the sidewall of the third source layer SL3 may be exposed. The second buffer pattern BP2 may be removed, and thus, the sidewall of the sacrificial layer FL may be exposed.

The portion of the insulating layer IL may be removed, and thus, an eighth sidewall SW8 of the insulating layer IL that is exposed by the first trench TR1 may be defined. The second buffer pattern BP2 may be removed, and thus, a ninth sidewall SW9 of the sacrificial layer FL that is exposed by the first trench TR1 may be defined. The first buffer pattern BP1 may be removed, and thus, a tenth sidewall SW10 of the third source layer SL3 that is exposed by the first trench TR1 may be defined.

The distance between the ninth sidewall SW9 and the first center line C1-C1' and the distance between the tenth sidewall SW10 and the first center line C1-C1' may be the same. The distance between the eighth sidewall SW8 and the first centerline C1-C1' may be greater than the distance between the ninth and tenth sidewalls SW9 and SW10 and the first centerline C1-C1'.

Figure 2K:
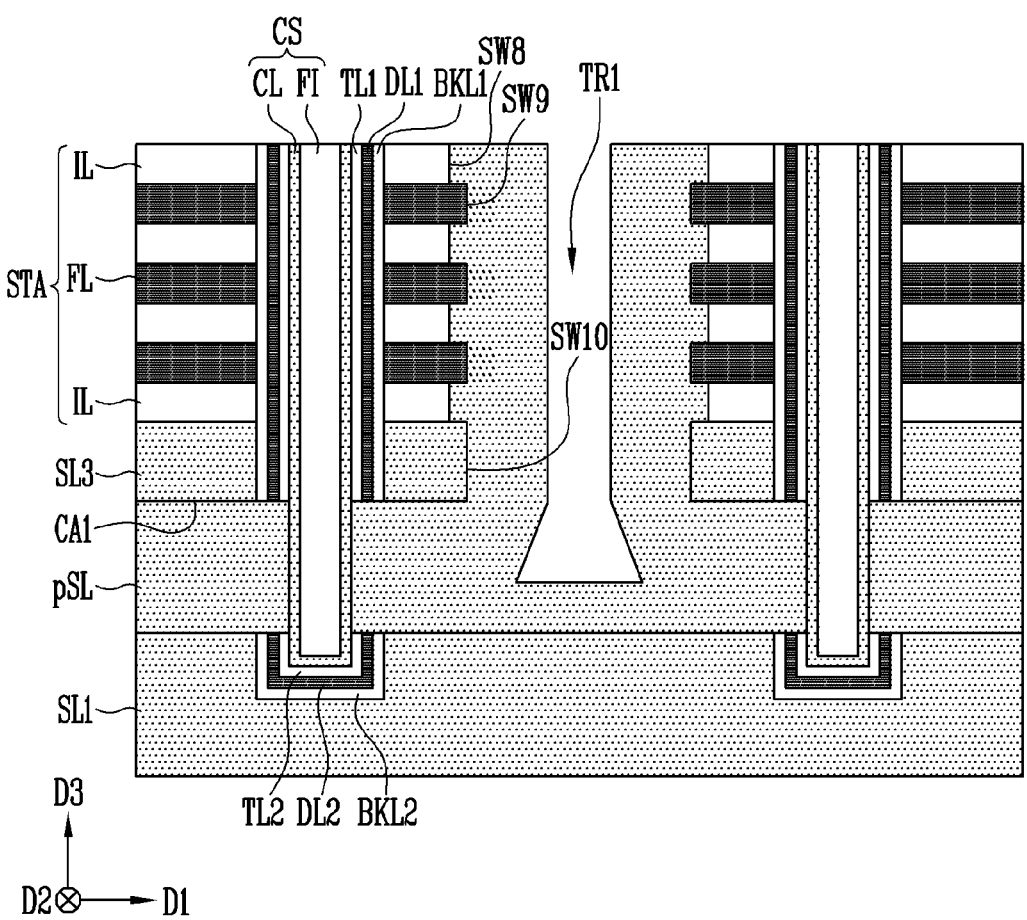

Referring to FIG. 2K, a preliminary source layer pSL may be formed in the first cavity CA1 and the first trench TR1. The preliminary source layer pSL may fill a portion of the first cavity CA1 and a portion of the first trench TR1. The preliminary source layer pSL may cover an upper surface of the first source layer SL1, a lower surface of the third source layer SL3, the tenth sidewall SW10 of the third source layer SL3, the ninth sidewall SW9 of the sacrificial layer FL, and the eighth sidewall SW8 of the insulating layer IL. The preliminary source layer pSL may contact the channel layer CL of the channel structure CS. The preliminary source layer pSL may include a semiconductor material. For example, the preliminary source layer pSL may include polysilicon.

Figure 2L:
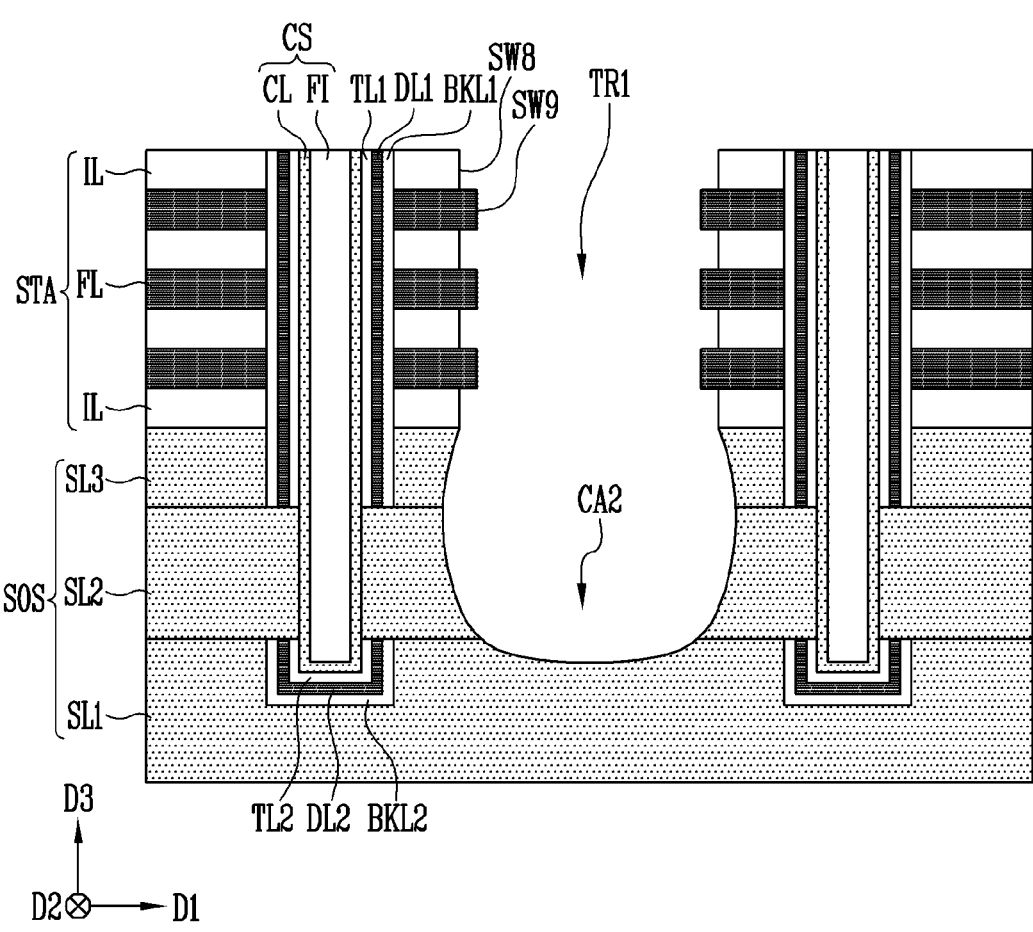

Referring to FIG. 2L, a portion of the preliminary source layer pSL (refer to FIG. 2K) may be removed. The portion that covers the tenth sidewall SW10 (refer to FIG. 2K) of the third source layer SL3 of the preliminary source layer pSL, the ninth sidewall SW9 of the sacrificial layer FL, and the eighth sidewall SW8 of the insulating layer IL may be removed. A portion that is formed in the first trench TR1 of the preliminary source layer pSL may be removed. The preliminary source layer pSL from which the portion is removed may be defined as the second source layer SL2. A portion of the third source layer SL3 may be removed together with a portion of the preliminary source layer pSL.

As the portion of the preliminary source layer pSL is removed, the first trench TR1 may be opened and the sacrificial layers FL and the insulating layers IL may be exposed again. As the portion of the preliminary source layer pSL is removed, a second cavity CA2 may be formed in the source structure SOS. The second cavity CA2 may be an empty space that is surrounded by the second source layer SL2. The second cavity CA2 may be connected to the first trench TR1.

Figure 2M:
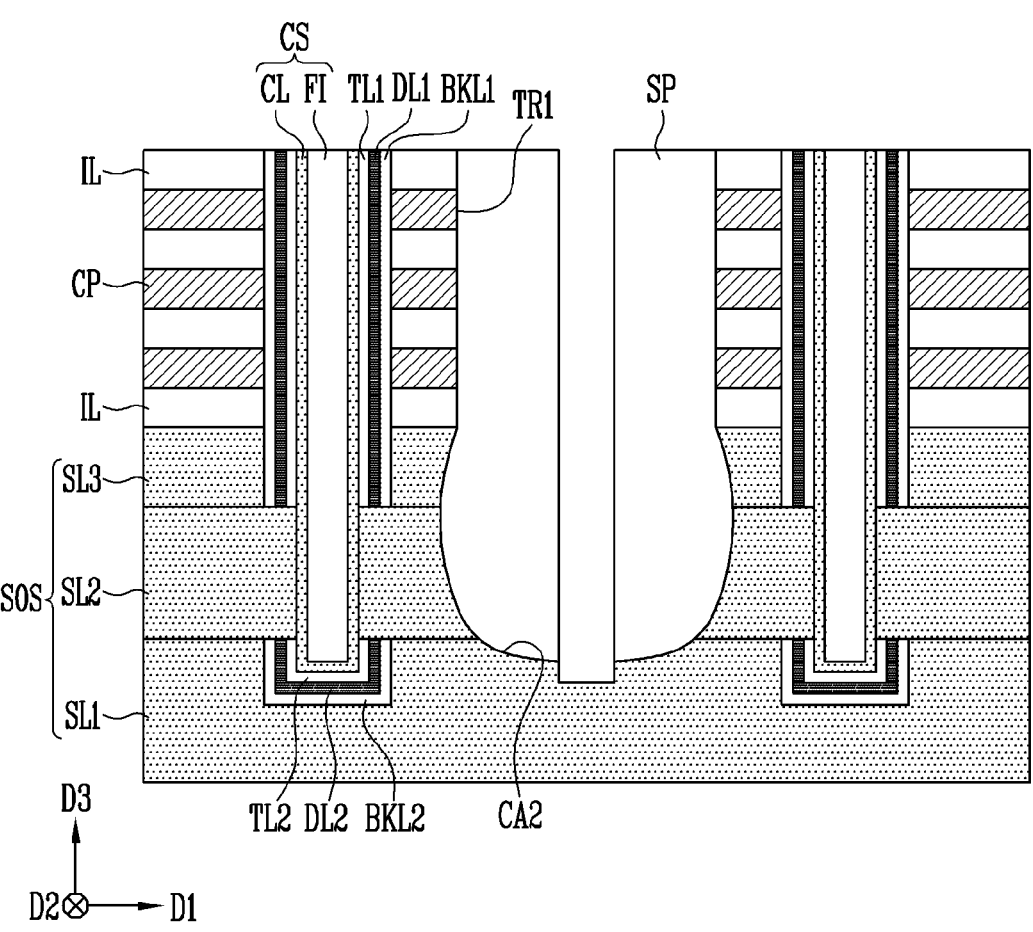

Referring to FIG. 2M, the sacrificial layers FL (refer to FIG. 2L) may be replaced with the conductive patterns CP. The replacing of the sacrificial layers FL with the conductive patterns CP may include removing the sacrificial layers FL that are exposed through the first trench TR1 and forming the conductive patterns CP.

Subsequently, the spacers SP may be formed in the first trench TR1 and the second cavity CA2. The forming of the spacers SP may include conformally forming a spacer layer in the first trench TR1 and the second cavity CA2 and removing a lower portion of the spacer layer through an anisotropic etching process. For example, a portion of the first source layer SL1 may be removed together with the lower portion of the spacer layer. The first source layer SL1 may be exposed between the spacers SP.

Subsequently, the source contact SC (refer to FIG. 1B) may be formed between the spacers SP.

In the method of manufacturing the semiconductor device, the first protective layer PL1 may protect the insulating layer IL of the stack structure STA and the second buffer pattern BP2 in a process of removing the source sacrificial layer SFL and removing a portion of the preliminary blocking layer pBKL. In addition, in a process of removing a portion of the preliminary data storage layer pDL, the second buffer pattern BP2 may protect the sacrificial layer FL of the stack structure STA. The first protective layer PL1 may be removed together in a process of removing the portion of the preliminary data storage layer pDL.

Accordingly, the preliminary source layer pSL may be formed in a state in which there is no separate layer that covers the sidewalls of the insulating layer IL and the sacrificial layer FL of the stack structure STA, and thus, the width of the first trench TR1 may be designed to be relatively small. As the width of the first trench TR1 is designed to be relatively small, the degree of integration of the semiconductor device may be improved.

In addition, as the second cavity CA2 is formed in a state in which there is no separate layer that covers the sidewalls of the insulating layer IL and the sacrificial layer FL of the stack structure STA, an over verify fail (OVF) based on the formation of the second cavity CA2 may be prevented.

FIGS. 3A to 3K are cross-sectional views illustrating a method of manufacturing a semiconductor device according to an embodiment of the present disclosure.

The method of manufacturing the semiconductor device according to FIGS. 3A to 3K may be similar to the method of manufacturing the semiconductor device according to FIGS. 2A to 2M, except as described below.

Figure 3A:
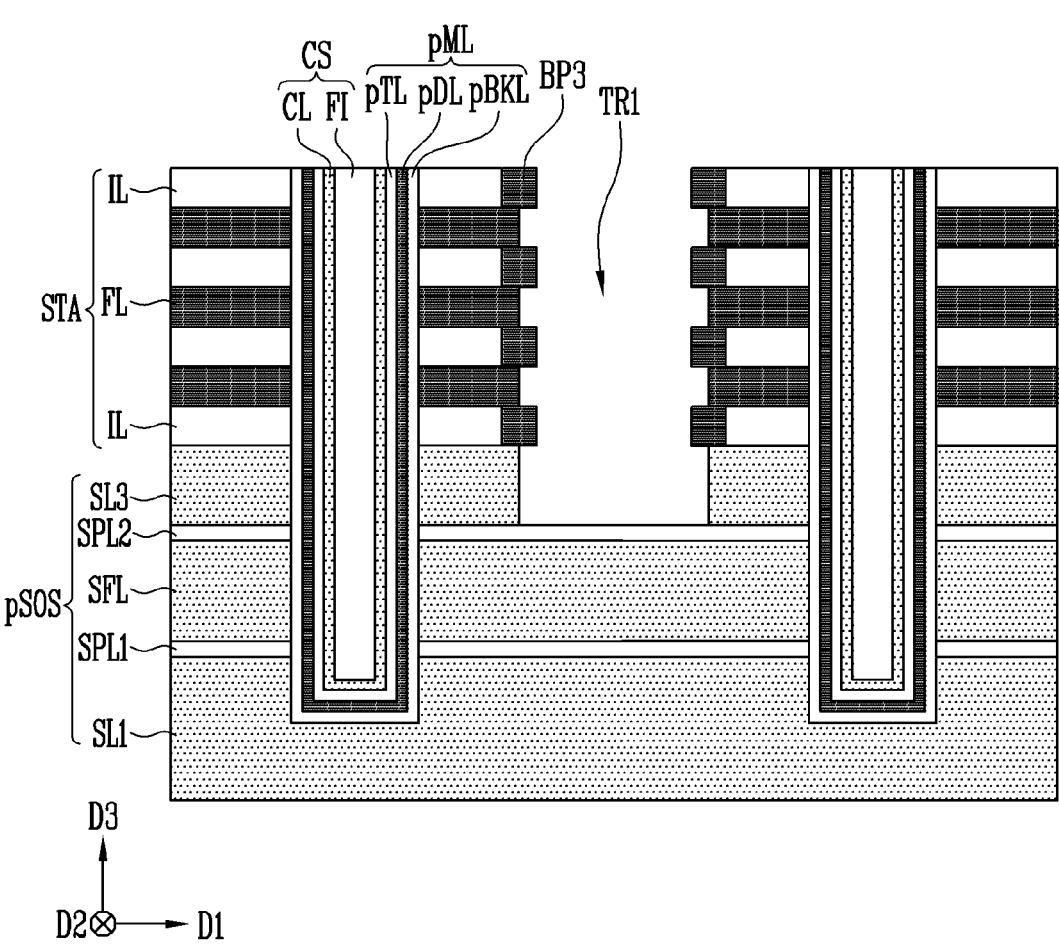
FIGS. 3A to 3K are cross-sectional views illustrating a method of manufacturing a semiconductor device according to an embodiment of the present disclosure.

Referring to FIG. 3A, similarly to that described with reference to FIGS. 2A to 2C, the preliminary source structure pSOS, the stack structure STA, the preliminary memory layer pML, the channel structure CS, and the first trench TR1 may be formed. The insulating layers IL of the stack structure STA may be defined as first material layers, and the sacrificial layers FL of the stack structure STA may be defined as second material layers.

Subsequently, a surface treatment may be performed on the insulating layers IL that are exposed by the first trench TR1. A surface treatment may be performed on the first material layers of the stack structure STA. For example, the surface treatment may be a nitriding process, and the insulating layers IL that are exposed by the first trench TR1 may be nitrided. A surface treatment may be performed on a portion of the insulating layer IL that is exposed by the first trench TR1 to form a third buffer pattern BP3. A portion of the insulating layer IL may be changed to a third buffer pattern BP3. The third buffer patterns BP3 may be disposed between the sacrificial layers FL. The third buffer patterns BP3 may overlap the sacrificial layers FL. The third buffer pattern BP3 may include the same material as the sacrificial layer FL. For example, the third buffer pattern BP3 may include nitride.

Figure 3B:
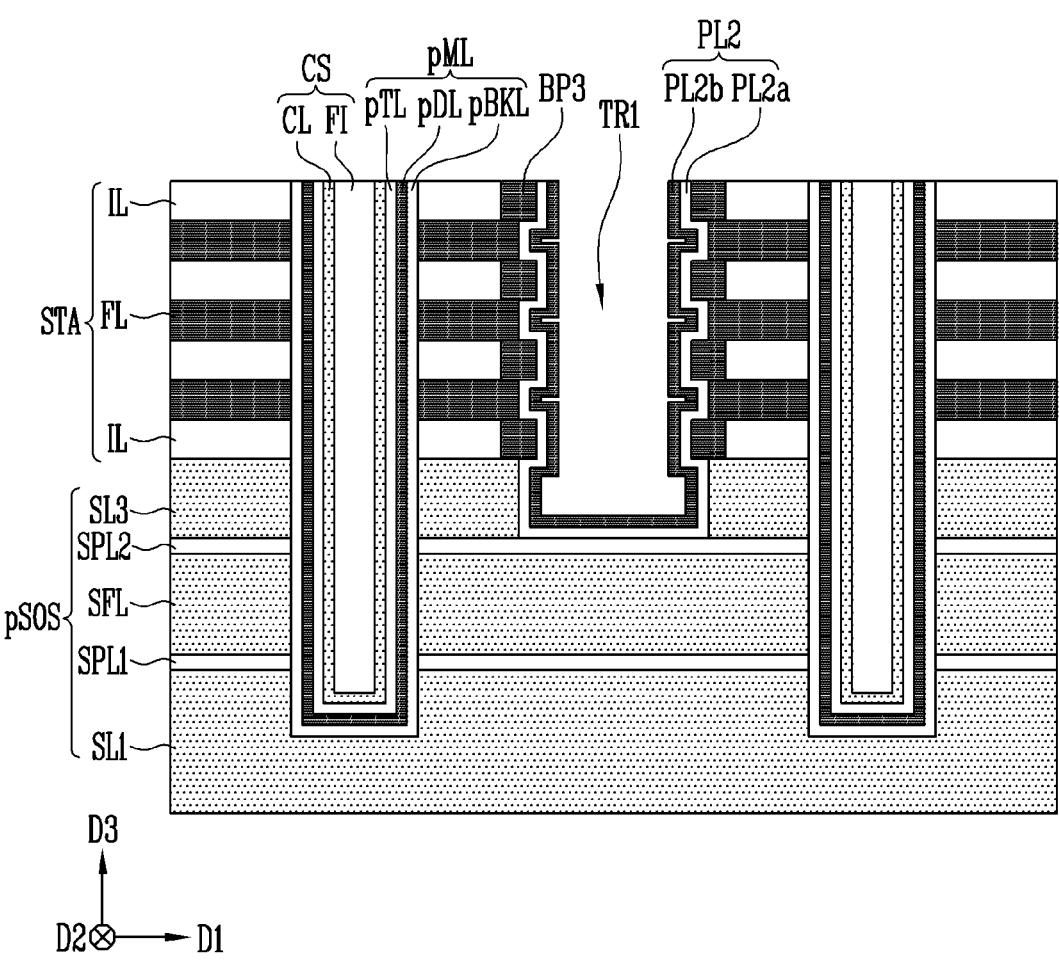

Referring to FIG. 3B, a second protective layer PL2 may be formed in the first trench TR1. The second protective layer PL2 may cover the sacrificial layers FL, the third buffer patterns BP3, the third source layer SL3, and the second source protective layer SPL2. The second protective layer PL2 may include portions that are interposed between the third buffer patterns BP3.

The second protective layer PL2 may have multiple layers. The second protective layer PL2 may include a first protective portion PL2a and a second protective portion PL2b. The first protective portion PL2a may be a layer that covers the sacrificial layers FL, the third buffer patterns BP3, the third source layer SL3, and the second source protective layer SPL2. The second protective portion PL2b may be a layer that covers the first protective portion PL2a. The first and second protective portions PL2a and PL2b may include different materials. In an embodiment, the second protective portion PL2b includes a material having an etching selectivity with respect to the first protective portion PL2a. The first protective portion PL2a may include the same material as the insulating layer IL. The second protective portion PL2b may include the same material as the sacrificial layer FL. For example, the first protective portion PL2a may include oxide, and the second protective portion PL2b may include nitride.

Figure 3C:
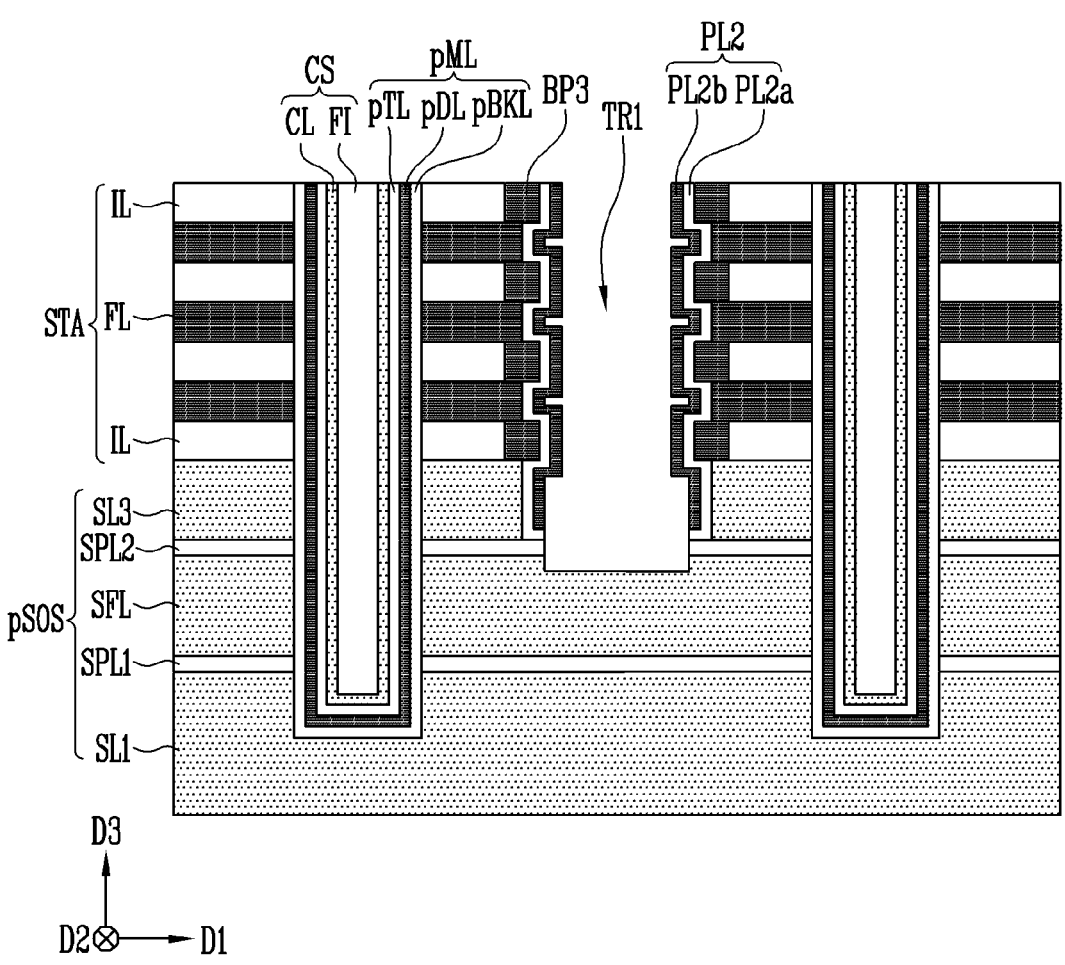

Referring to FIG. 3C, a lower portion of the second protective layer PL2, a portion of the second source protective layer SPL2, and a portion of the source sacrificial layer SFL may be removed through the first trench TR1. While the portion of the second source protective layer SPL2 and the portion of the source sacrificial layer SFL are being removed, the second protective layer PL2 may protect the third buffer patterns BP3 and the sacrificial layers FL.

Figure 3D:
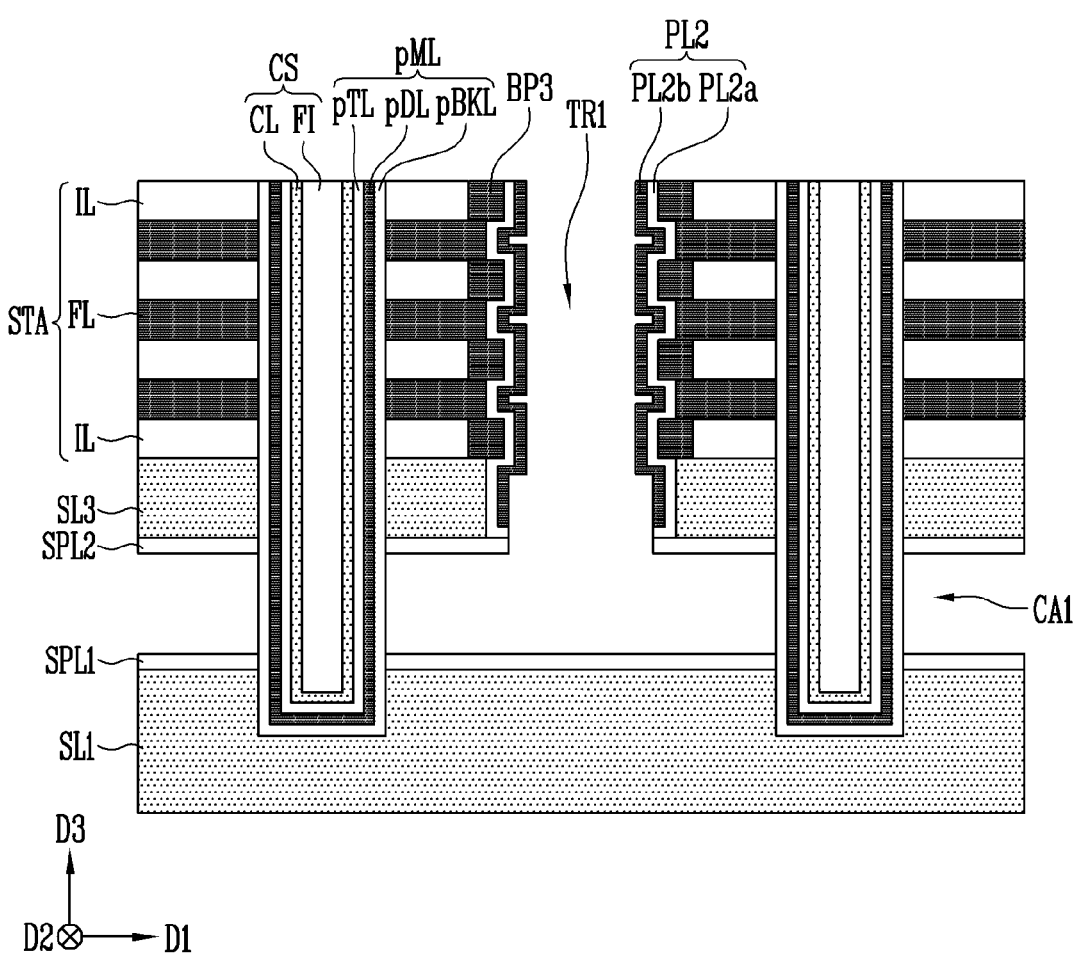

Referring to FIG. 3D, the source sacrificial layer SFL (refer to FIG. 3C) may be removed. While the source sacrificial layer SFL is being removed, the second protective layer PL2 may protect the third buffer patterns BP3, the sacrificial layers FL, and the third source layer SL3. While the source sacrificial layer SFL is being removed, the first and second source protective layers SPL1 and SPL2 might not be etched. The source sacrificial layer SFL may be removed, and thus, the first cavity CA1 may be formed. The source sacrificial layer SFL may be removed, and thus, a portion of the preliminary blocking layer pBKL of the preliminary memory layer pML may be exposed.

Figure 3E:
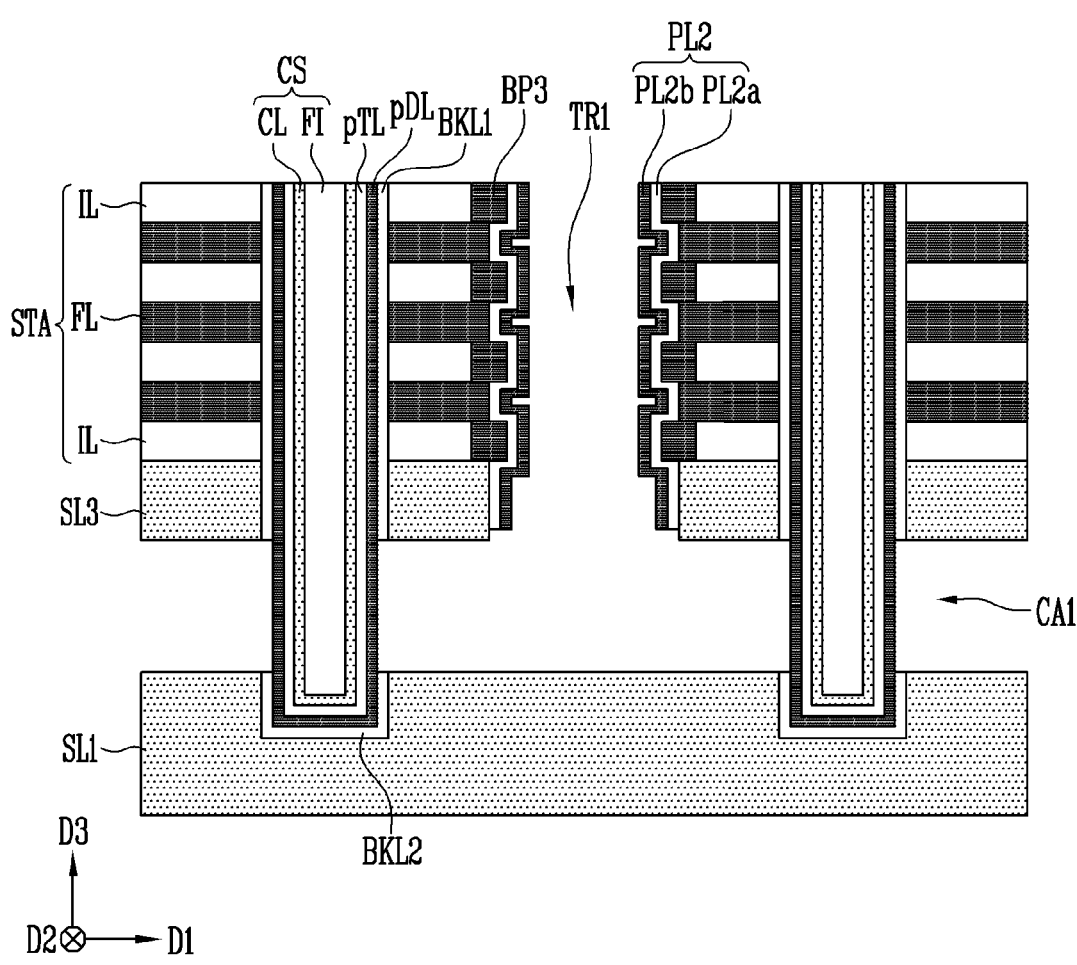

Referring to FIG. 3E, the portion of the preliminary blocking layer pBKL (refer to FIG. 3D) that is exposed by the first cavity CA1 may be removed. The portion of the preliminary blocking layer pBKL may be removed, and thus, the preliminary blocking layer pBKL may be divided into a first blocking layer BKL1 and a second blocking layer BKL2. The portion of the preliminary blocking layer pBKL may be removed, and thus, a portion of the preliminary data storage layer pDL may be exposed.

The first and second source protective layers SPL1 and SPL2 (refer to FIG. 3D) may be removed simultaneously with removing the portion of the preliminary blocking layer pBKL or through a separate process.

While the portion of the preliminary blocking layer pBKL and the first and second source protective layers SPL1 and SPL2 are being removed, the second protective layer PL2 may protect the third buffer patterns BP3, the sacrificial layers FL, and the third source layer SL3.

Figure 3F:
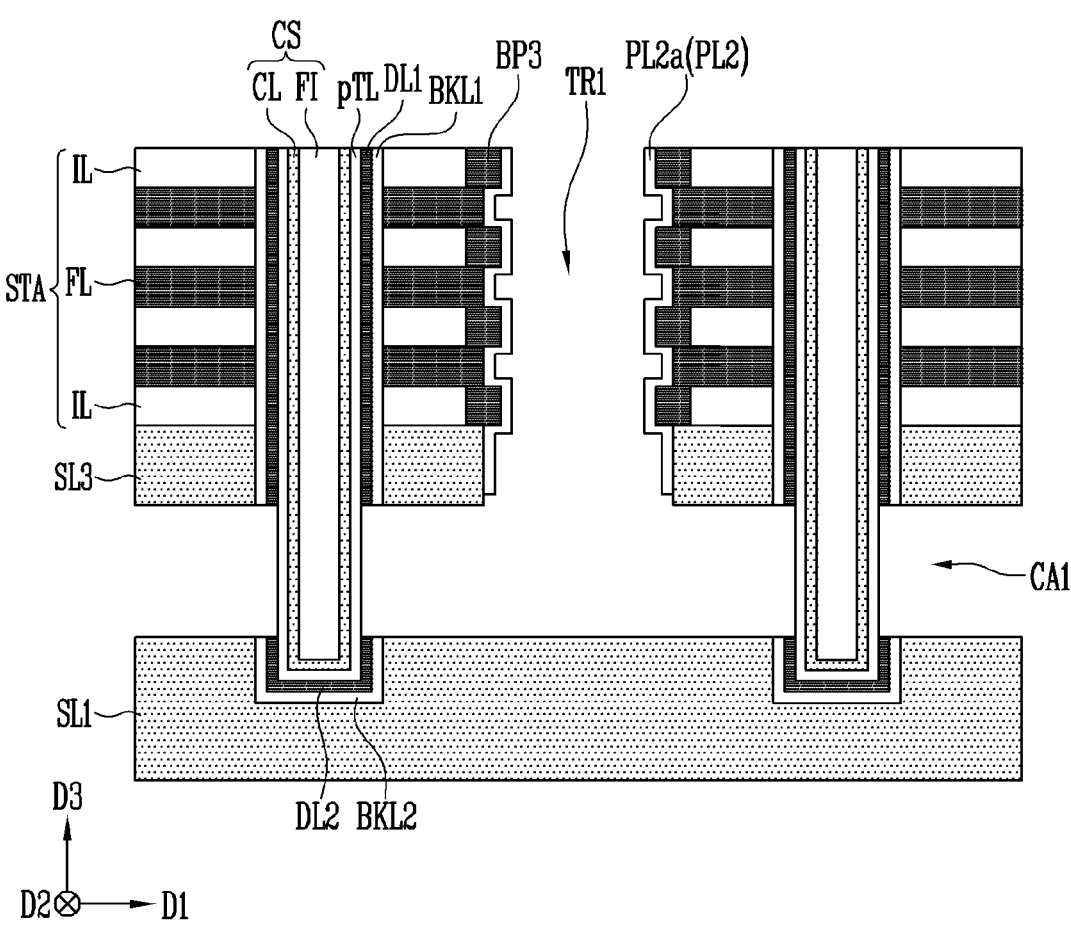

Referring to FIG. 3F, the portion of the preliminary data storage layer pDL (refer to FIG. 3E) that is exposed by the first cavity CA1 may be removed. The portion of the preliminary data storage layer pDL may be removed, and thus, the preliminary data storage layer pDL may be divided into a first data storage layer DL1 and a second data storage layer DL2. The portion of the preliminary data storage layer pDL may be removed, and thus, a portion of the preliminary tunnel insulating layer pTL may be exposed.

The second protective portion PL2*b* (refer to FIG. 3E) of the second protective layer PL2 (refer to FIG. 3E) may be removed simultaneously with removing the portion of the preliminary data storage layer pDL or through a separate process. For example, when the portion of the preliminary data storage layer pDL and the second protective portion PL2*b* are simultaneously removed, the portion of the preliminary data storage layer pDL and the second protective portion PL2*b* may be simultaneously removed by a fourth etching material inserted into the first trench TR1 and the first cavity CA1. The fourth etching material may be a material that is capable of etching the preliminary data storage layer pDL and the second protective portion PL2*b* of the second protective layer PL2. The second protective portion PL2*b* of the second protective layer PL2 may be removed, and thus, the first protective portion PL2*a* of the second protective layer PL2 may be exposed.

Figure 3G:
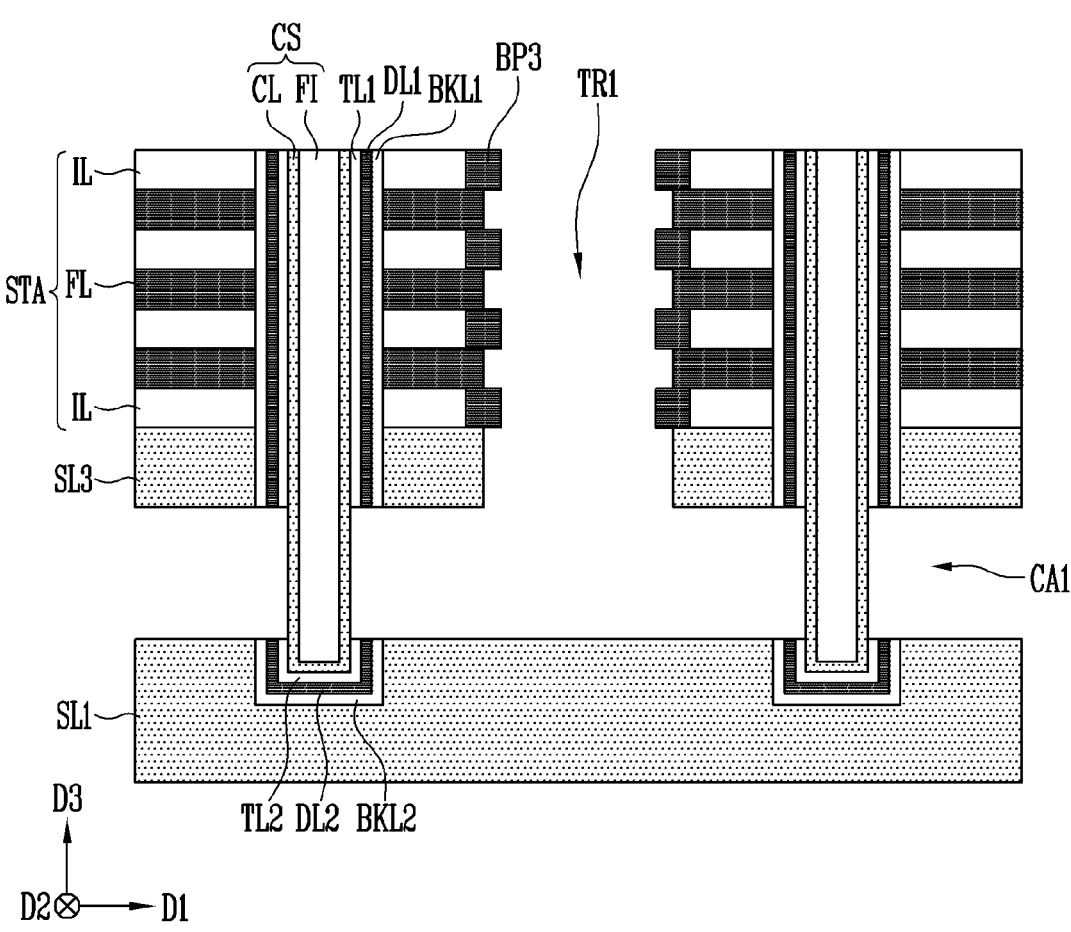

Referring to FIG. 3G, the portion of the preliminary tunnel insulating layer pTL (refer to FIG. 3F) that is exposed by the first cavity CA1 may be removed. The portion of the preliminary tunnel insulating layer pTL may be removed, and thus, the preliminary tunnel insulating layer pTL may be divided into a first tunnel insulating layer TL1 and a second tunnel insulating layer TL2. The portion of the preliminary tunnel insulating layer pTL may be removed, and thus, a portion of the channel layer CL may be exposed.

The first protective portion PL2*a* of the second protective layer PL2 (refer to FIG. 3F) may be removed simultaneously with removing the portion of the preliminary tunnel insulating layer pTL or through a separate process. For example, when the portion of the preliminary tunnel insulating layer pTL and the first protective portion PL2*a* of the second protective layer PL2 are simultaneously removed, the portion of the preliminary tunnel insulating layer pTL and the first protective portion PL2*a* of the second protective layer PL2 may be simultaneously removed by a fifth etching material inserted into the first trench TR1 and the first cavity CA1. The fifth etching material may be a material that is capable of etching the preliminary tunnel insulating layer pTL and the first protective portion PL2*a* of the second protective layer PL2. The first protective portion PL2*a* of the second protective layer PL2 may be removed, and thus, the third buffer patterns BP3, the sacrificial layers FL, and the third source layer SL3 may be exposed.

Figure 3H:
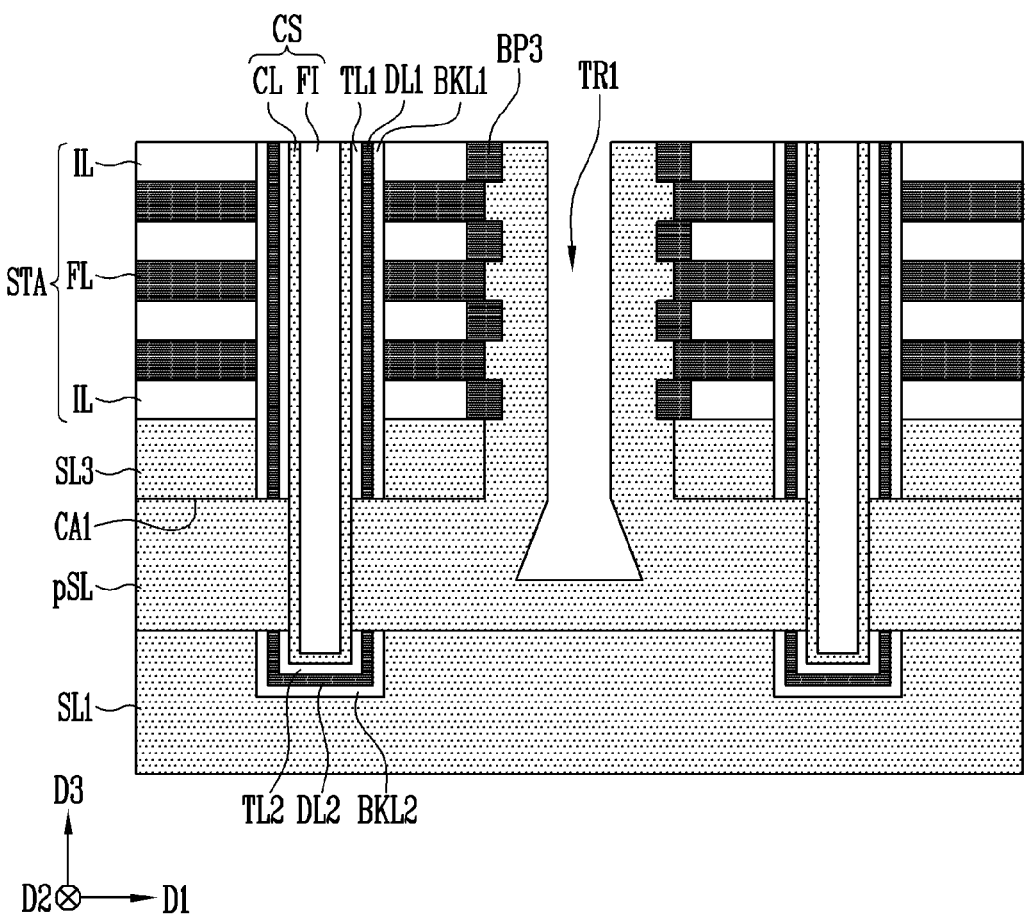

Referring to FIG. 3H, a preliminary source layer pSL may be formed in the first cavity CA1 and the first trench TR1. The preliminary source layer pSL may cover the third buffer patterns BP3, the sacrificial layers FL, the third source layer SL3, and the first source layer SL1. The preliminary source layer pSL may contact the channel layer CL of the channel structure CS.

Figure 3I:
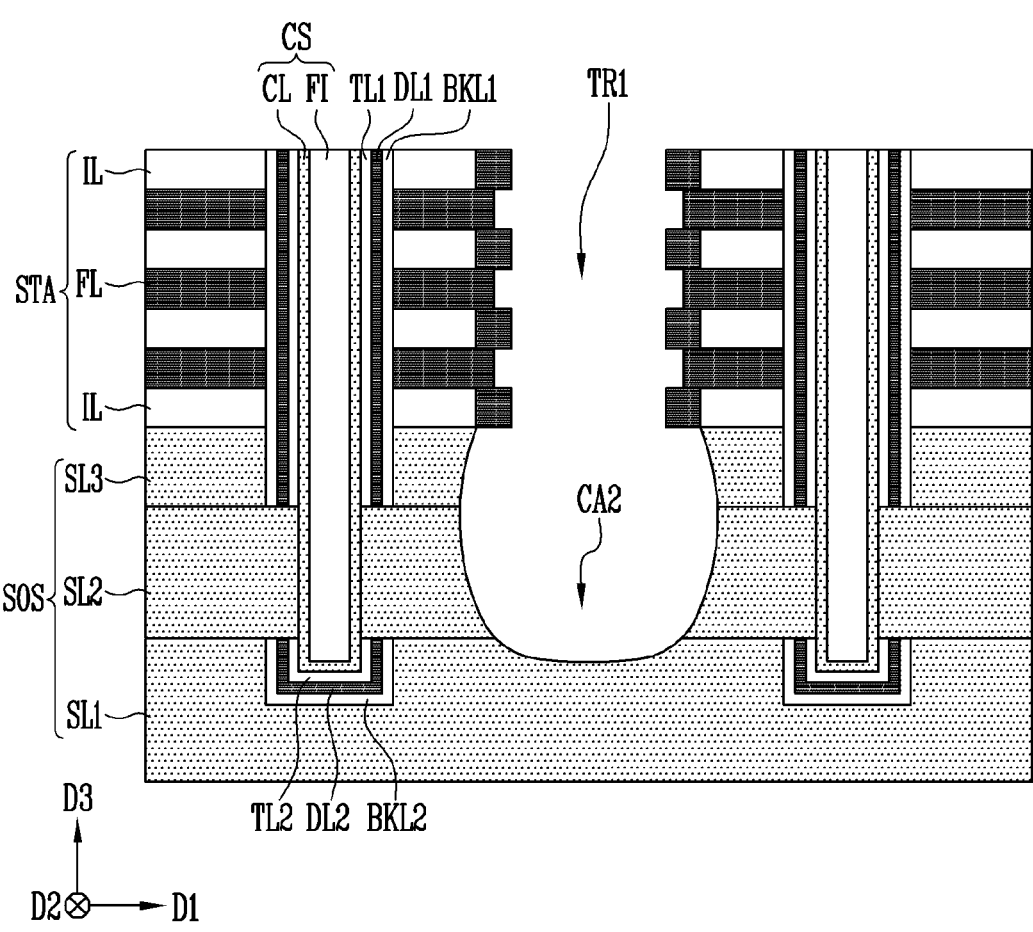

Referring to FIG. 3I, a portion of the preliminary source layer pSL (refer to FIG. 3H) may be removed. The portion of the preliminary source layer pSL covering the third buffer patterns BP3, the sacrificial layers FL, and the third source layer SL3 may be removed. The preliminary source layer pSL from which the portion is removed may be defined as the second source layer SL2. A portion of the third source layer SL3 may be removed together with the portion of the preliminary source layer pSL.

As the portion of the preliminary source layer pSL is removed, the first trench TR1 may be opened, and the sacrificial layers FL and the third buffer patterns BP3 may be exposed again. As the portion of the preliminary source layer pSL is removed, the second cavity CA2 may be formed in the source structure SOS.

Figure 3J:
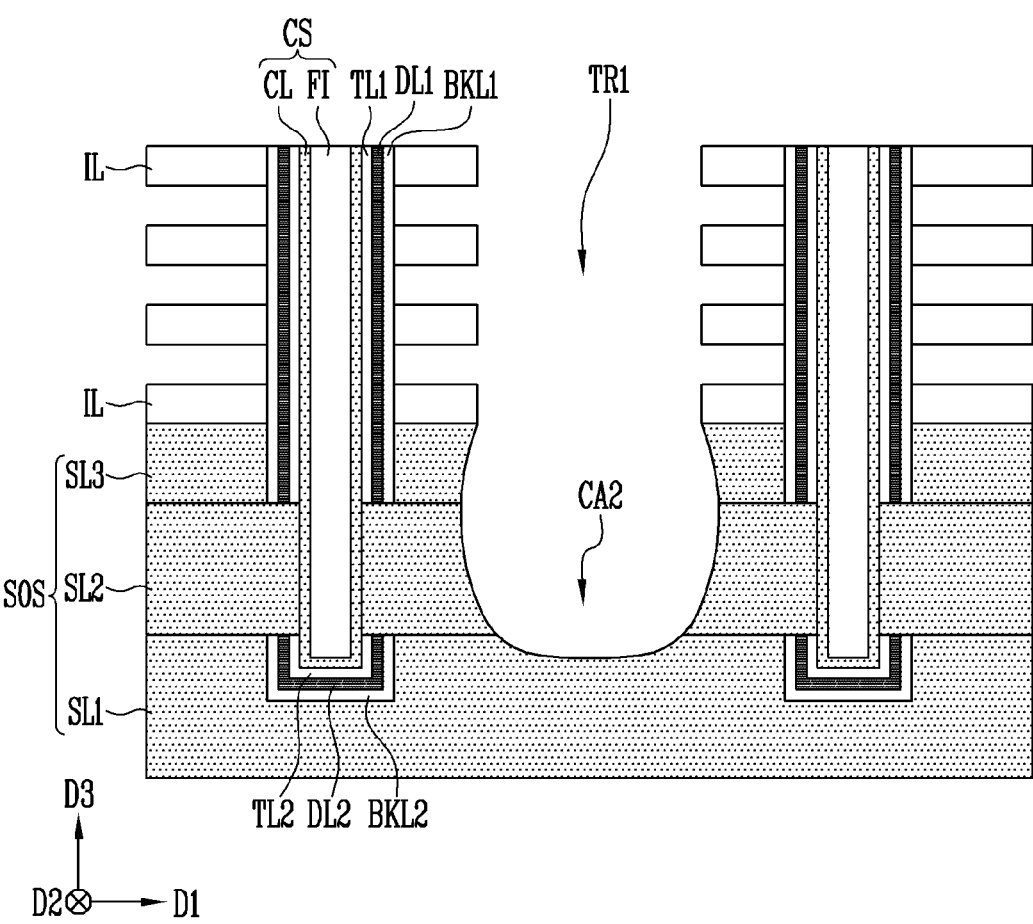

Referring to FIG. 3J, the third buffer patterns BP3 and the sacrificial layers FL may be removed. The third buffer patterns BP3 and the sacrificial layers FL may be simultaneously removed. The third buffer patterns BP3 and the sacrificial layers FL may be removed by a sixth etching material inserted into the first trench TR1.

Figure 3K:
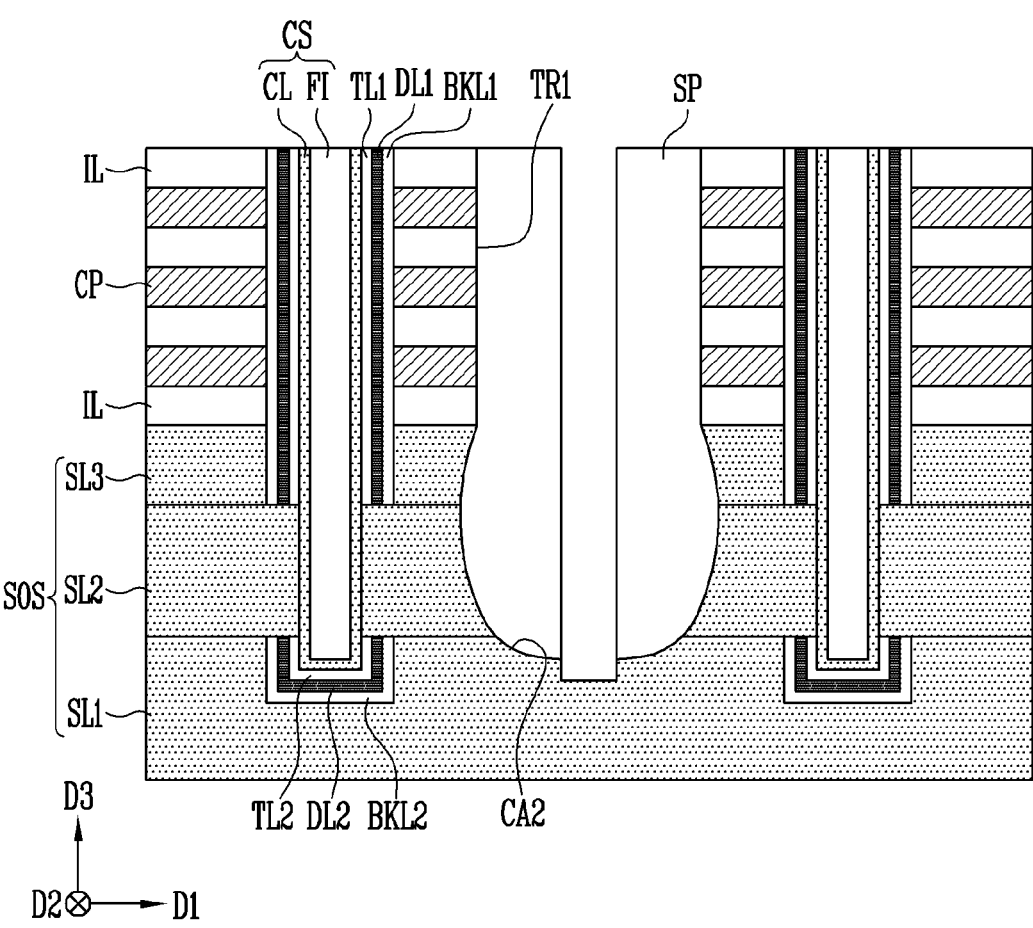

Referring to FIG. 3K, the conductive patterns CP may be formed in empty spaces from which the sacrificial layers FL are removed. Subsequently, the spacers SP may be formed in the first trench TR1 and the second cavity CA2. Subsequently, the source contact may be formed between the spacers SP.

In the method of manufacturing the semiconductor device, the second protective layer PL2 may protect the sacrificial layer FL of the stack structure STA, the third buffer pattern BP3, and the third source layer SL3 in a process of removing the source sacrificial layer SFL, a process of removing a portion of the preliminary blocking layer pBKL, and a process of removing a portion of the preliminary data storage layer pDL. In addition, in a process of removing a portion of the preliminary tunnel insulating layer pTL, the third buffer pattern BP3 may protect the insulating layer IL of the stack structure STA. The second protective layer PL2 may be removed in a process of removing a portion of the preliminary data storage layer pDL and a process of removing the preliminary tunnel insulating layer pTL.

Accordingly, the preliminary source layer pSL may be formed in a state in which there is no separate layer covering the sidewalls of the insulating layer IL and the sacrificial layer FL of the stack structure STA, and thus, the width of the first trench TR1 may be designed to be relatively small. As the width of the first trench TR1 is designed to be relatively small, the degree of integration of the semiconductor device may be improved.

In addition, as the second cavity CA2 is formed in a state in which there is no separate layer covering the sidewalls of the insulating layer IL and the sacrificial layer FL of the stack structure STA, an over verify fail (OVF) based on the formation of the second cavity CA2 may be prevented.

FIGS. 4A to 4E are cross-sectional views illustrating a method of manufacturing a semiconductor device according to an embodiment of the present disclosure.

Figure 4A:
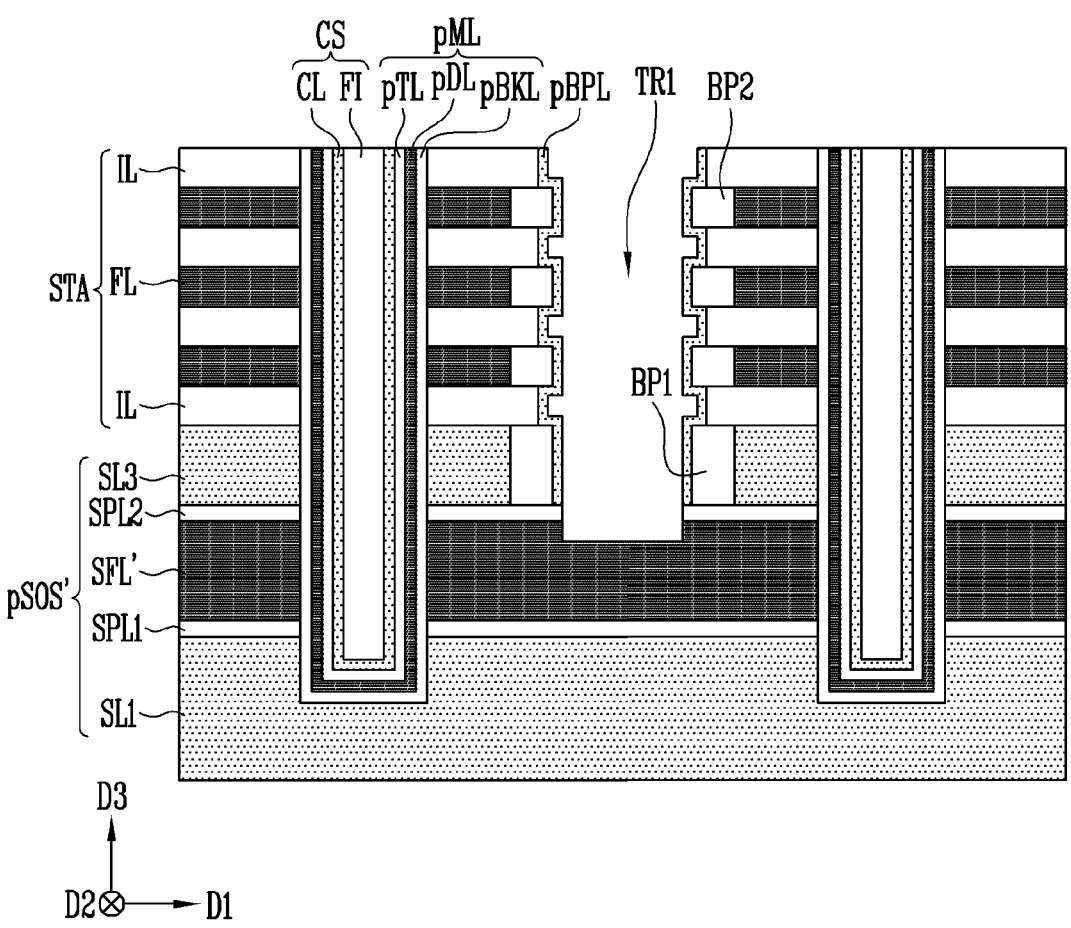
FIGS. 4A to 4E are cross-sectional views illustrating a method of manufacturing a semiconductor device according to an embodiment of the present disclosure.

Referring to FIG. 4A, a preliminary source structure pSOS' including the first source layer SL1, the first source protective layer SPL1, a source sacrificial layer SFL', the second source protective layer SPL2, and the third source layer SL3 may be formed. The first source layer SL1 may be a lower source layer, and the third source layer SL3 may be an upper source layer. The source sacrificial layer SFL' may be disposed between the first source layer SL1 and the third source layer SL3. The first source protective layer SPL1 may be disposed between the source sacrificial layer SFL' and the first source layer SL1. The second source protective layer SPL2 may be disposed between the source sacrificial layer SFL' and the third source layer SL3.

Each of the first source layer SL1 and the third source layer SL3 may include a semiconductor material. The source sacrificial layer SFL' may include a material having an etch selectivity with respect to the first source layer SL1 and the third source layer SL3. The first source protective layer SPL1 and the second source protective layer SPL2 may include a material having an etch selectivity with respect to each of the source sacrificial layer SFL, the first source layer SL1, and the third source layer SL3. As an embodiment, the source sacrificial layer SFL' may include a nitride, and the first source protective layer SPL1 and the second source protective layer SPL2 may include an oxide.

Subsequently, the stack STA may be formed on the preliminary source structure pSOS'. As described with reference to FIG. 2A, the stack STA may include the first material layers and the second material layers alternately disposed in the third direction D3. As an embodiment, the first material layers may be the insulating layers IL, and the second material layers may be the sacrificial layers FL having an etch selectivity with respect to the insulating layers IL. Each of the insulating layers IL may include oxide such as a silicon oxide layer, and each of the sacrificial layers FL may include nitride such as a silicon nitride layer.

Thereafter, first holes H01 extending from an inside of the stack STA into the preliminary source structure pSOS' may be formed. As described with reference to FIG. 2B, the first holes H01 may pass through the stack STA, the third source layer SL3, and the source sacrificial layer SFL, and may extend into the first source layer SL1. Subsequently, as described with reference to FIG. 2B, a preliminary blocking layer pBLK, a preliminary data storage layer pDL, and a preliminary tunnel insulating layer pTL of the preliminary memory layer pML may be sequentially formed in each of the first holes H01. Thereafter, the channel layer CL may be formed along a surface of the preliminary memory layer pML. When a central area of the first hole H01 is opened by the channel layer CL, the central area of the first hole H01 may be filled with a filling layer FI. The channel layer CL and the filling layer FI may form a channel structure CS. By the above-described process, the preliminary memory layer pML may be disposed between the channel layer CL and the stack STA. The channel layer CL may be used as a channel of a memory cell string and may be formed of a semiconductor material such as silicon or germanium. The filling layer FI may include an insulating material.

Subsequently, as described with reference to FIG. 2C, the first trench TR1 may be formed. The first trench TR1 may pass through the stack STA and the third source layer SL3. The channel structures CS and the preliminary memory layers pML may be surrounded by the stack STA at both sides of the first trench TR1.

Thereafter, as described with reference to FIG. 2D, side portions of each of the sacrificial layers FL and the third source layer SL3 may be surface-treated through the first trench TR1 through an oxidation process. Accordingly, the first buffer pattern BP1 and the second buffer patterns BP2 identical to those described with reference to FIG. 2D may be formed. A portion of the third source layer SL3 may remain between the first buffer pattern BP1 and the preliminary memory layer pML. Portions of the sacrificial layers FL may remain between the second buffer patterns BP2 and the preliminary memory layer pML.

The first buffer pattern BP1, the second buffer patterns BP2, and the insulating layers IL may include surfaces opened toward the first trench TR1. A preliminary buffer layer pBPL may be formed along the surfaces of the first buffer pattern BP1, the second buffer patterns BP2, and the insulating layers IL. The preliminary buffer layer pBPL may be conformally formed to cover the first buffer pattern BP1, the second buffer patterns BP2, and the insulating layers IL.

As an embodiment, the preliminary buffer layer pBPL may include a silicon layer. After the preliminary buffer layer pBPL is formed, a portion of the preliminary buffer layer pBPL may be removed from a bottom of the first trench TR1 through an anisotropic etching process. Accordingly, the preliminary buffer layer pBPL may remain on a sidewall of the first trench TR1, and the bottom of the first trench TR1 may be opened.

Thereafter, a portion of the second source protective layer SPL2 may be removed through an etching process through the bottom of the first trench TR1 opened by the preliminary buffer layer pBPL. Accordingly, the source sacrificial layer SFL' may be exposed.

Figure 4B:
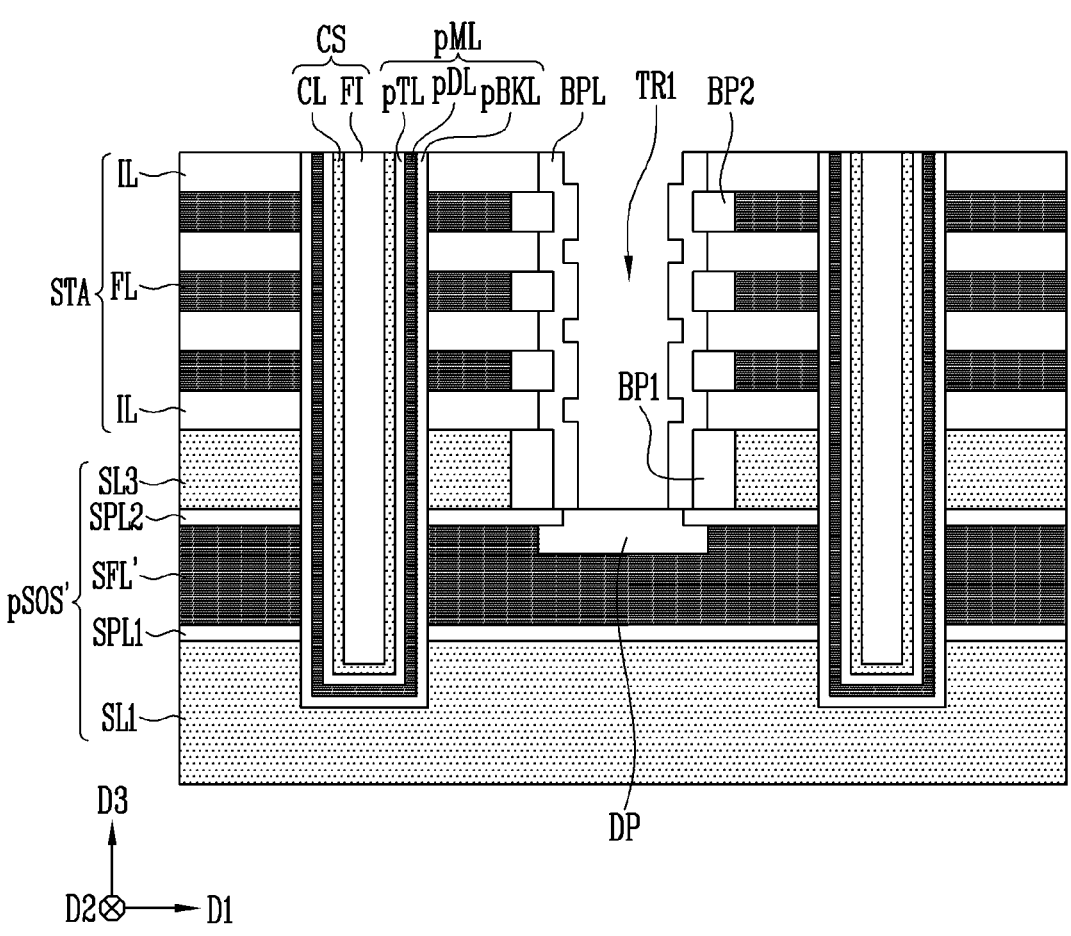

Referring to FIG. 4B, a buffer layer BPL may be formed by oxidizing the preliminary buffer layer pBPL shown in FIG. 4A. At this time, an exposed area of the source sacrificial layer SFL' may be oxidized, and thus a dummy pattern DP may be formed.

Figure 4C:
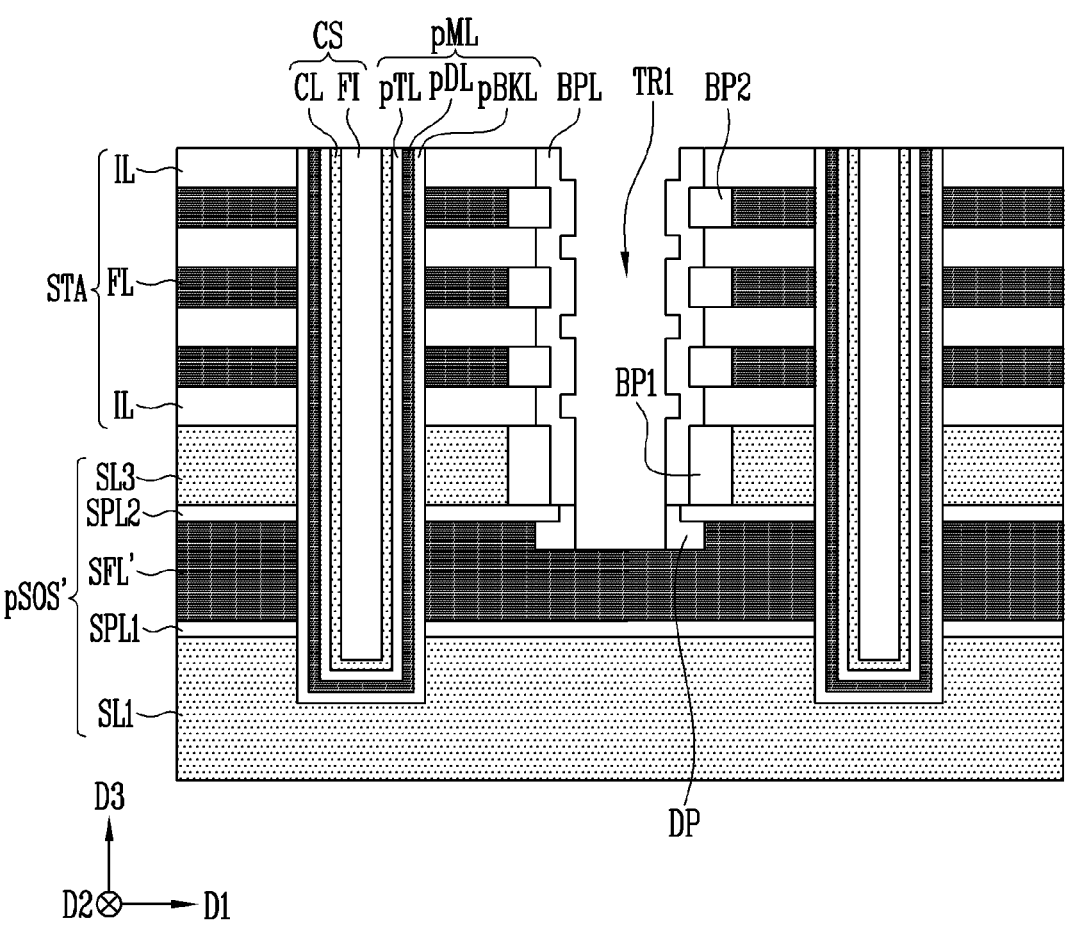

Referring to FIG. 4C, a portion of the dummy pattern DP may be removed by an anisotropic etching process. Accordingly, the first trench TR1 may extend into the source sacrificial layer SFL', and the source sacrificial layer SFL' which is not oxidized and which is remained may be exposed by the first trench TR1.

Figure 4D:
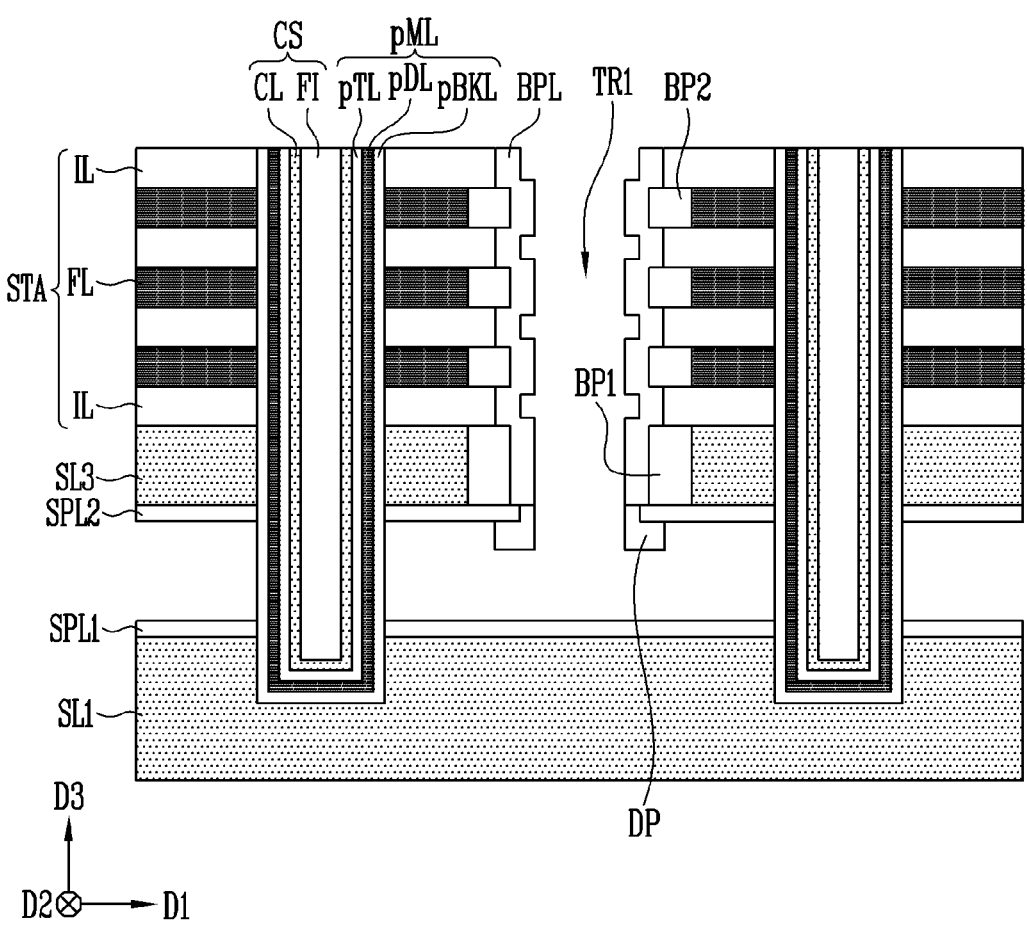

Referring to FIG. 4D, the source sacrificial layer SFL' shown in FIG. 4C may be removed. At this time, the source sacrificial layer SFL' formed of the nitride may be selectively removed, and the buffer layer BPL, the first source protective layer SPL1, and the second source protective layer SPL2 formed of the oxide may remain without being removed during an etching process for removing the nitride. A portion of the preliminary memory layer pML may be exposed through a space between the first source protective layer SPL1 and the second source protective layer SPL2.

Figure 4E:
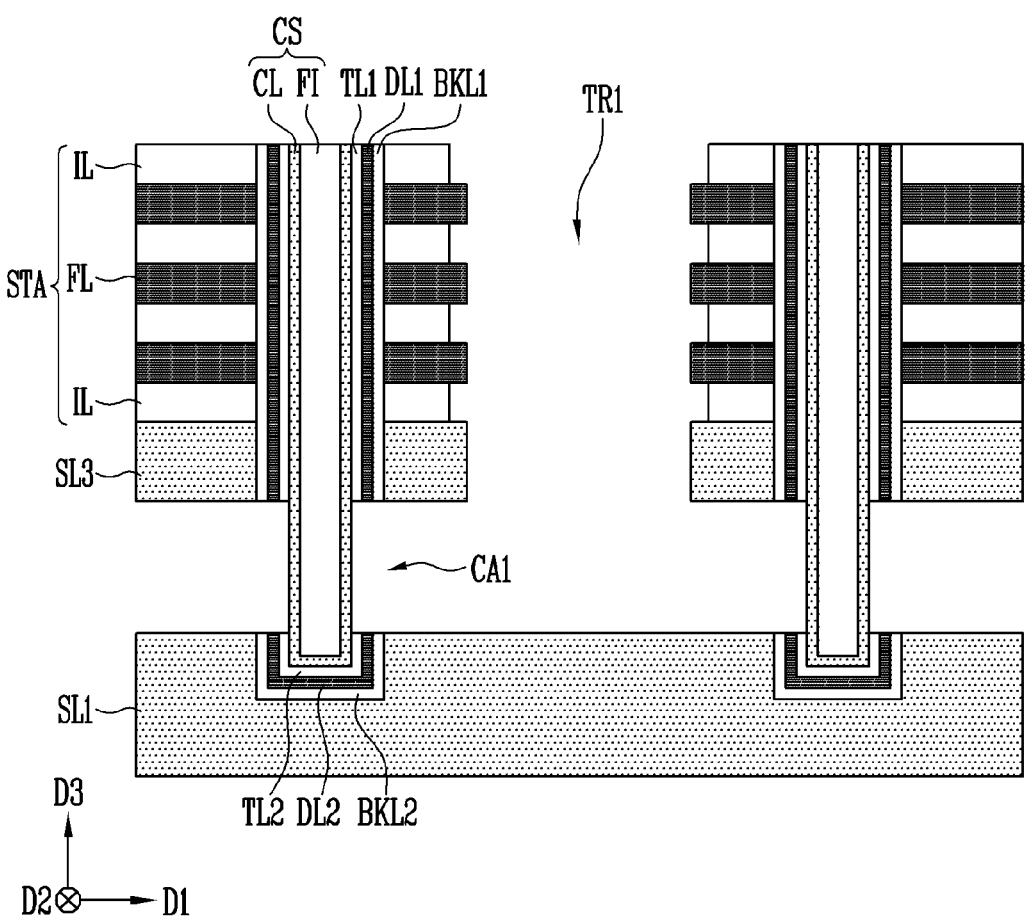

Referring to FIG. 4E, the portion of the preliminary memory layer pML exposed in FIG. 4D may be removed by an etching process. Accordingly, the first cavity CA1 exposing the channel layer CL may be defined. As described with reference to FIGS. 2H to 2J, the preliminary blocking layer pBLK shown in FIG. 4D may be separated into the first blocking layer BKL1 and the second blocking layer BKL2 by the first cavity CA1, the preliminary data storage layer pDL shown in FIG. 4D may be separated into the first data storage layer DL1 and the second data storage layer DL2 by the first cavity CA1, and the preliminary tunnel insulating layer pTL shown in FIG. 4D may be separated into the first tunnel insulating layer TL1 and the second tunnel insulating layer TL2 by the first cavity CA1.

During the etching process for removing the portion of the preliminary memory layer pML, the first source protective layer SPL1 and the second source protective layer SPL2 shown in FIG. 4D may be removed. Accordingly, the first source layer SL1 and the third source layer SL3 may be exposed through the first cavity CA1. In addition, the buffer layer BPL, the first buffer pattern BP1, the second buffer patterns BP2, and the dummy pattern DP shown in FIG. 4D may be etched. As an embodiment, the buffer layer BPL, the first buffer pattern BP1, the second buffer patterns BP2, and the dummy pattern DP may be removed using the etching process for removing the portion of the preliminary memory layer pML. A portion of the insulating layer IL may be removed while the buffer layer BPL, the first buffer pattern BP1, the second buffer patterns BP2, and the dummy pattern DP are removed.

As the buffer layer BPL, the first buffer pattern BP1, the second buffer patterns BP2, and the dummy pattern DP are removed, a width of the first trench TR1 may be expanded in the first direction D1. In addition, a sidewall of the third source layer SL3, a sidewall of the insulating layer IL, and a sidewall of the sacrificial layer FL may be exposed by the expanded first trench TR1.

Thereafter, subsequent processes identical to those described with reference to FIGS. 2K to 2M may be performed. Accordingly, the semiconductor memory device described with reference to FIGS. 1A and 1B may be formed.

FIGS. 5A to 5E are cross-sectional views illustrating a method of manufacturing a semiconductor device according to an embodiment of the present disclosure.

Figure 5A:
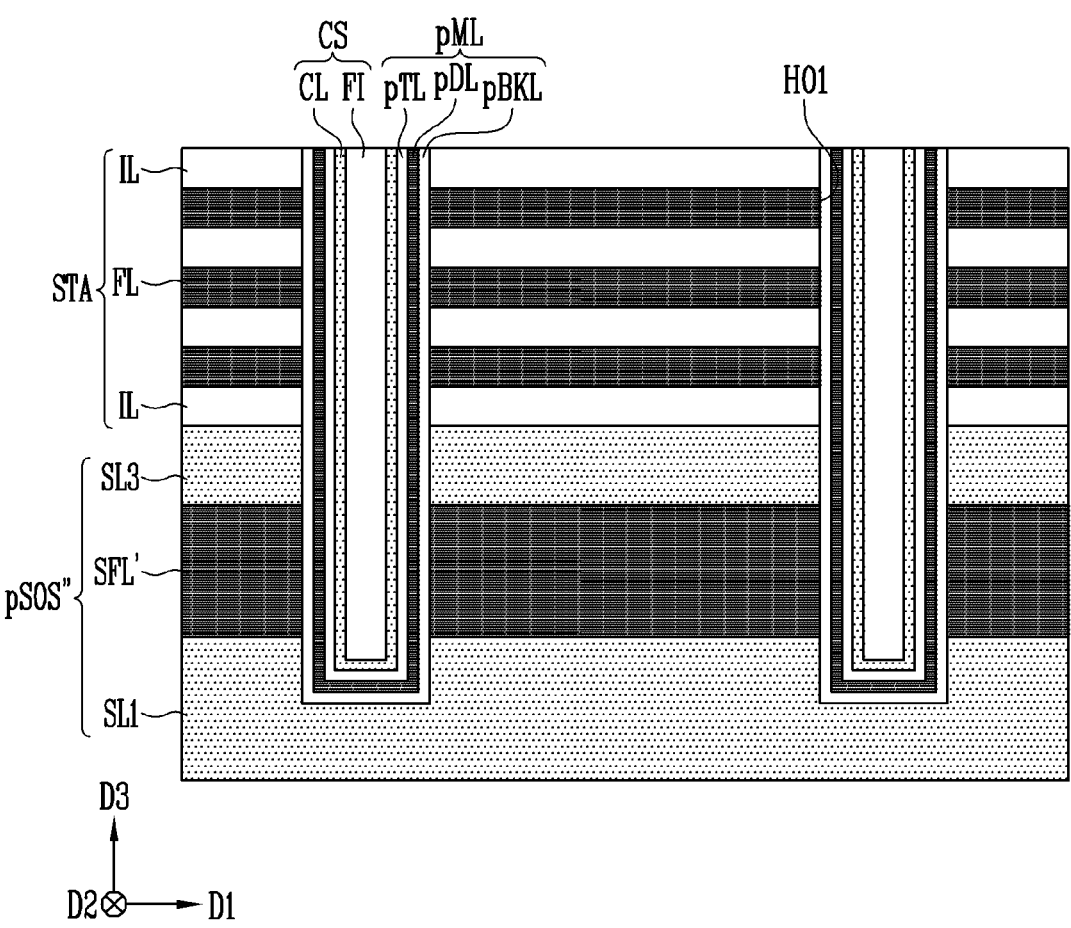
FIGS. 5A to 5E are cross-sectional views illustrating a method of manufacturing a semiconductor device according to an embodiment of the present disclosure.

Referring to FIG. 5A, a preliminary source structure pSOS" including the first source layer SL1, the source sacrificial layer SFL, and the third source layer SL3 may be formed. The first source layer SL1 may be a lower source layer, and the third source layer SL3 may be an upper source layer. The source sacrificial layer SFL' may be disposed between the first source layer SL1 and the third source layer SL3, and may be in contact with the first source layer SL1 and the third source layer SL3. The first source layer SL1, the source sacrificial layer SFL, and the third source layer SL3 may be formed of the materials identical to those described with reference to FIG. 4A.

Subsequently, as described with reference to FIG. 4A, the stack STA including the insulating layers IL and the sacrificial layers FL may be formed on the preliminary source structure pSOS". Thereafter, as described with reference to FIG. 4A, the first hole H01, the preliminary blocking layer pBLK, the preliminary data storage layer pDL, and the preliminary tunnel insulating layer pTL of the preliminary memory layer pML, the channel layer CL of the channel structure CS, and the filling layer FI may be formed.

Figure 5B:
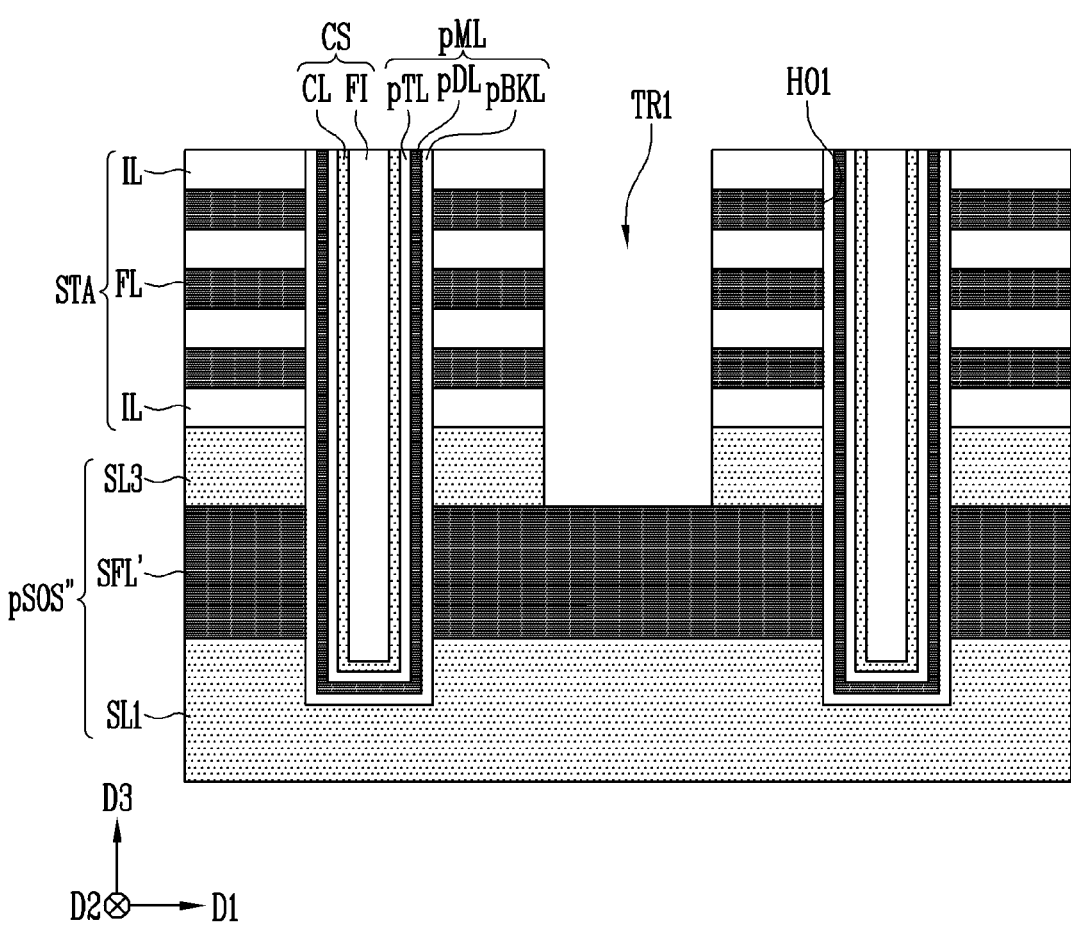

Referring to FIG. 5B, the first trench TR1 passing through the stack STA and the third source layer SL3 may be formed. The source sacrificial layer SFL' may be exposed by the first trench TR1.

Figure 5C:
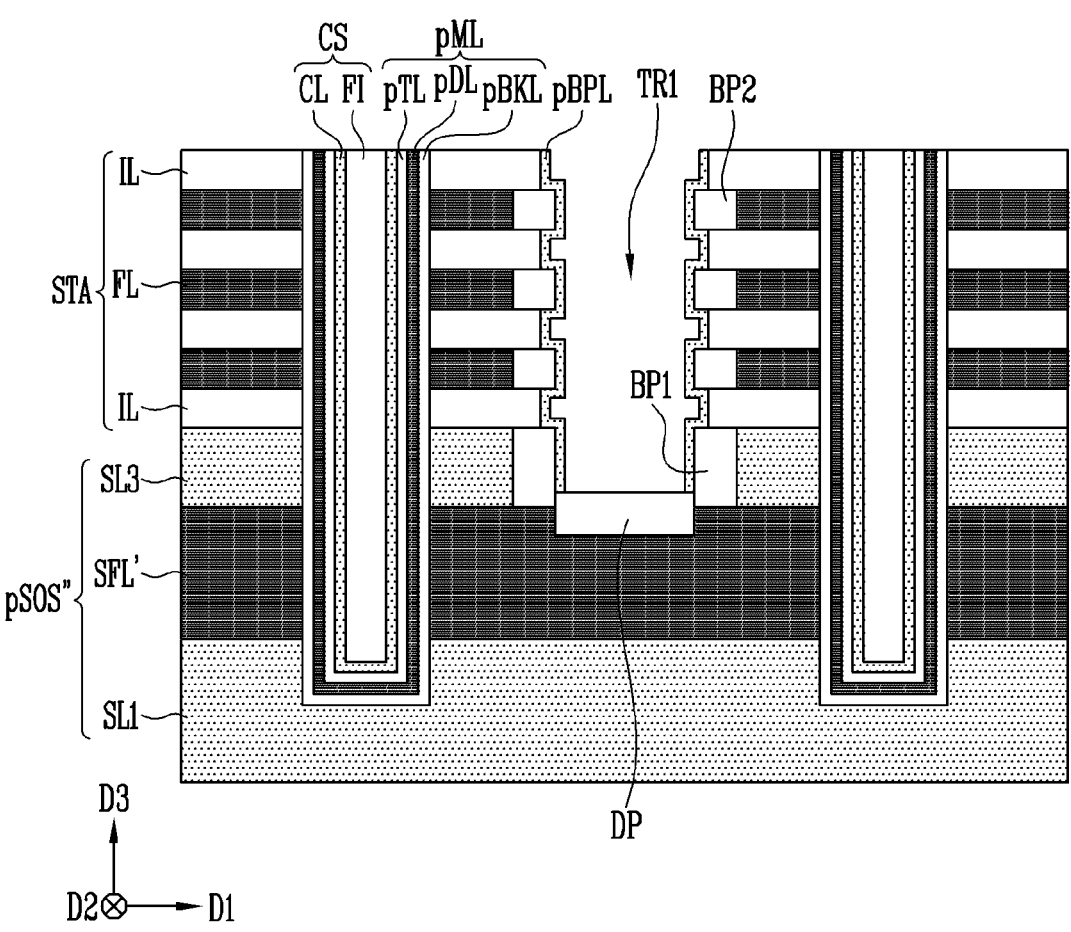

Referring to FIG. 5C, sidewalls of each of the sacrificial layers FL and the third source layer SL3 may be surface-treated through the first trench TR1 through an oxidation process. Accordingly, the first buffer pattern BP1 and the second buffer patterns BP2 identical to those described with reference to 2D may be formed. While the first buffer pattern BP1 and the second buffer patterns BP2 are formed, a partial area of the source sacrificial layer SFL' exposed by the first trench TR1 may be oxidized, and thus the dummy pattern DP may be formed. A portion of the source sacrificial layer SFL' may remain between the dummy pattern DP and the first source layer SL1.

Subsequently, the preliminary buffer layer pBPL may be formed. The preliminary buffer layer pBPL may be conformally formed along the surfaces of each of the first buffer pattern BP and the second buffer patterns BP2 and the insulating layers IL opened toward the first trench TR1. As an embodiment, the preliminary buffer layer pBPL may be a silicon layer. The preliminary buffer layer pBPL may be formed on a sidewall of the first trench TR1, and the dummy pattern DP may be opened through the bottom of the first trench TR1.

Figure 5D:
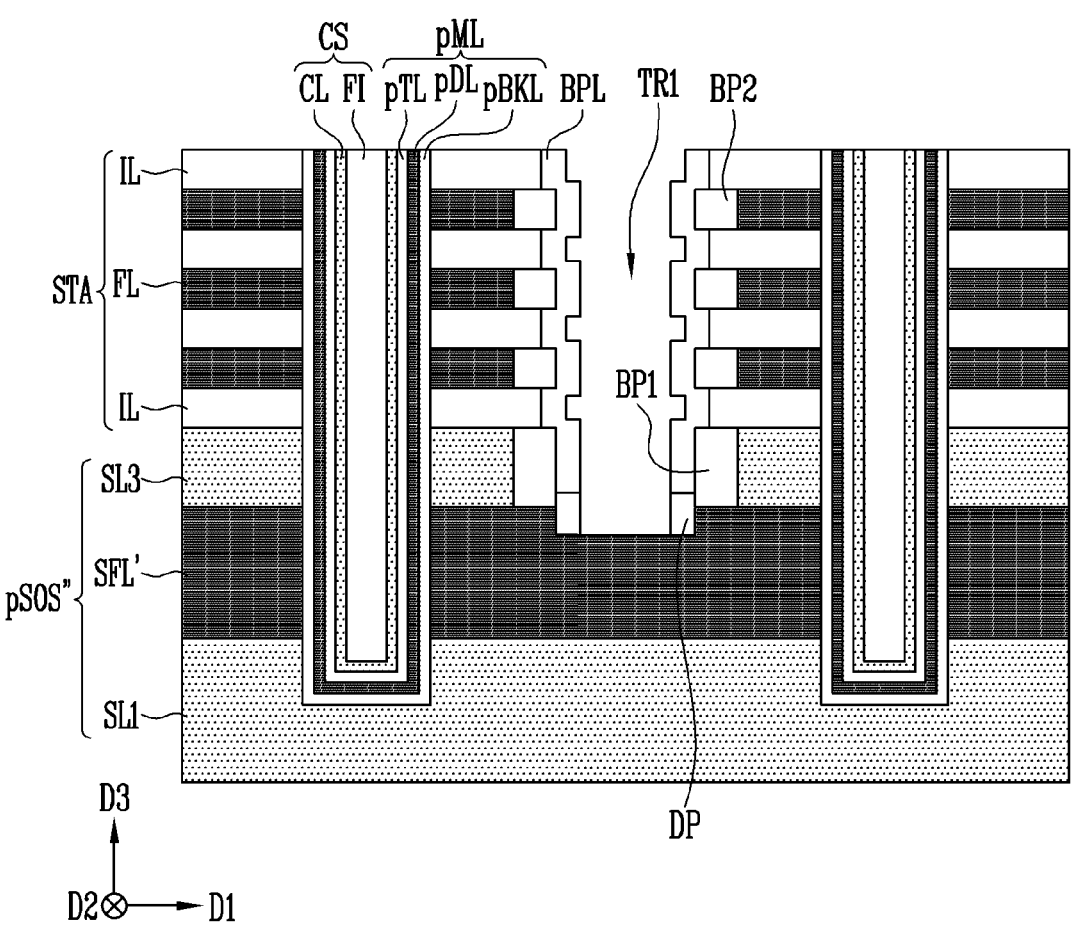

Referring to FIG. 5D, the buffer layer BPL may be formed by oxidizing the preliminary buffer layer pBPL shown in FIG. 5C. Subsequently, a portion of the dummy pattern DP exposed through the first trench TR1 shown in FIG. 5C may be removed through an anisotropic etching process so that the source sacrificial layer SFL' is opened.

Figure 5E:
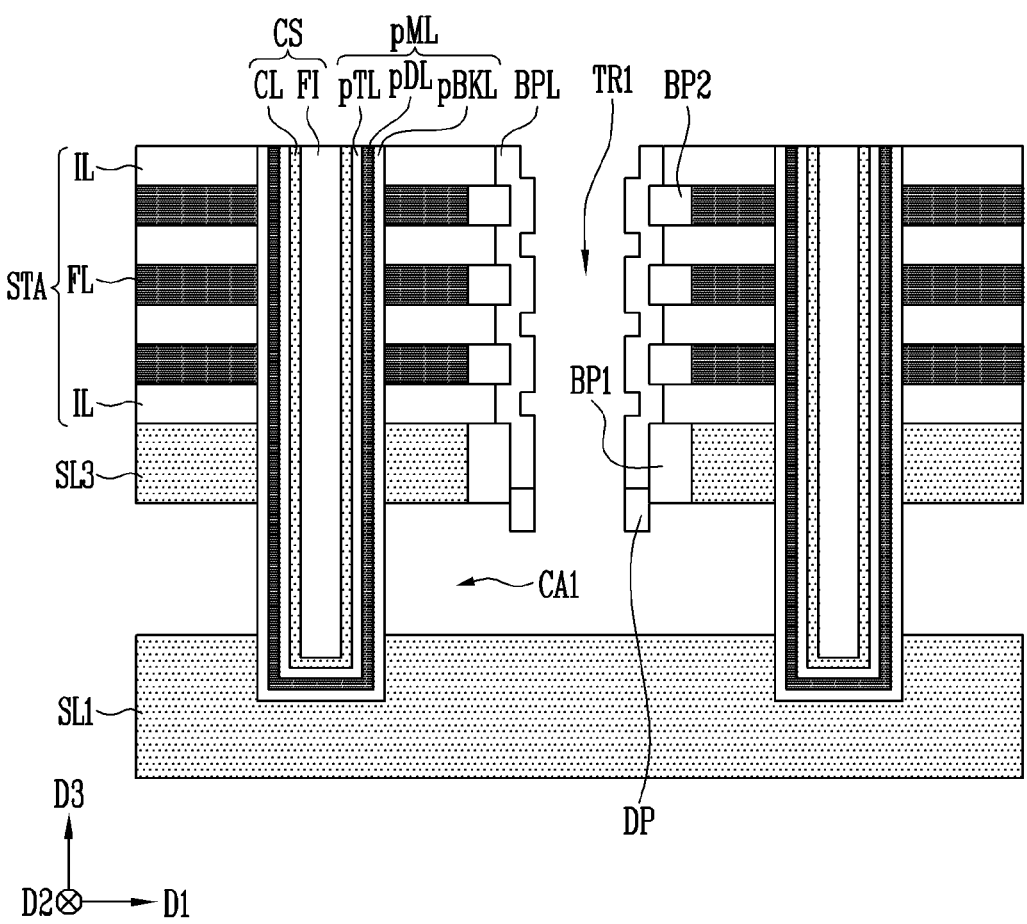

Referring to FIG. 5E, the source sacrificial layer SFL' shown in FIG. 5D may be removed. At this time, the source sacrificial layer SFL' formed of the nitride may be selectively removed, and the buffer layer BPL and the dummy pattern DP formed of the oxide may remain without being removed. Accordingly, the first cavity CA1 exposing a portion of the preliminary memory layer pML may be defined between the first source layer SL1 and the third source layer SL3.

Thereafter, subsequent process identical to those described with reference to FIG. 4E, subsequent processes identical to those described with reference to FIGS. 2K to 2M may be performed. Accordingly, the semiconductor memory device described with reference to FIGS. 1A and 1B may be formed.

Figure 6:
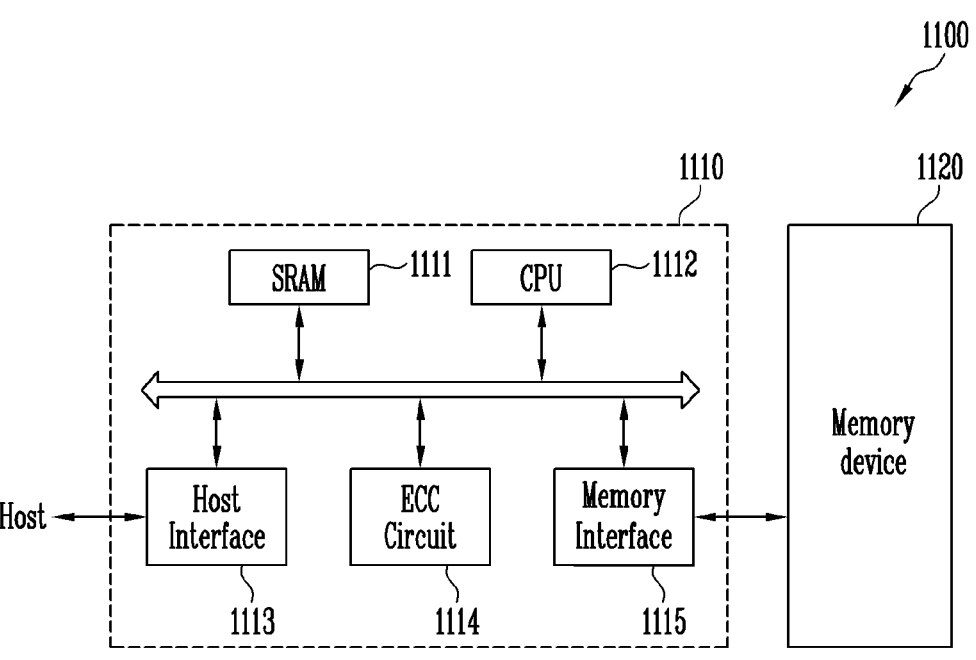
FIG. 6 is a block diagram, illustrating a configuration of a memory system, according to an embodiment of the present disclosure.

FIG. 6 is a block diagram illustrating a configuration of a memory system according to an embodiment of the present disclosure.

Referring to FIG. 6, the memory system 1100 includes a memory device 1120 and a memory controller 1110.

The memory device 1120 may include the structure described with reference to FIGS. 1A and 1B. The memory device 1120 may be a multi-chip package configured of a plurality of flash memory chips.

The memory controller 1110 may be configured to control the memory device 1120, and may include a static random access memory (SRAM) 1111, a central processing unit (CPU) 1112, a host interface 1113, and an error correction code (ECC) circuit 1114, and a memory interface 1115. The SRAM 1111 is used as an operation memory of the CPU 1112, the CPU 1112 performs various control operations for exchanging data of the memory controller 1110, and the host interface 1113 includes a data exchange protocol of a host that is connected to the memory system 1100. In addition, the ECC circuit 1114 detects and corrects an error included in data read from the memory device 1120, and the memory interface 1115 performs an interfacing with the memory device 1120. In addition, the memory controller 1110 may further include a read only memory (ROM) or the like for storing code data for interfacing with the host.

The memory system 1100 described above may be a memory card or a solid state disk (SSD) in which the memory device 1120 and the memory controller 1110 are combined to each other. For example, when the memory system 1100 is an SSD, the memory controller 1110 may communicate with the outside (for example, the host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE).

Figure 7:
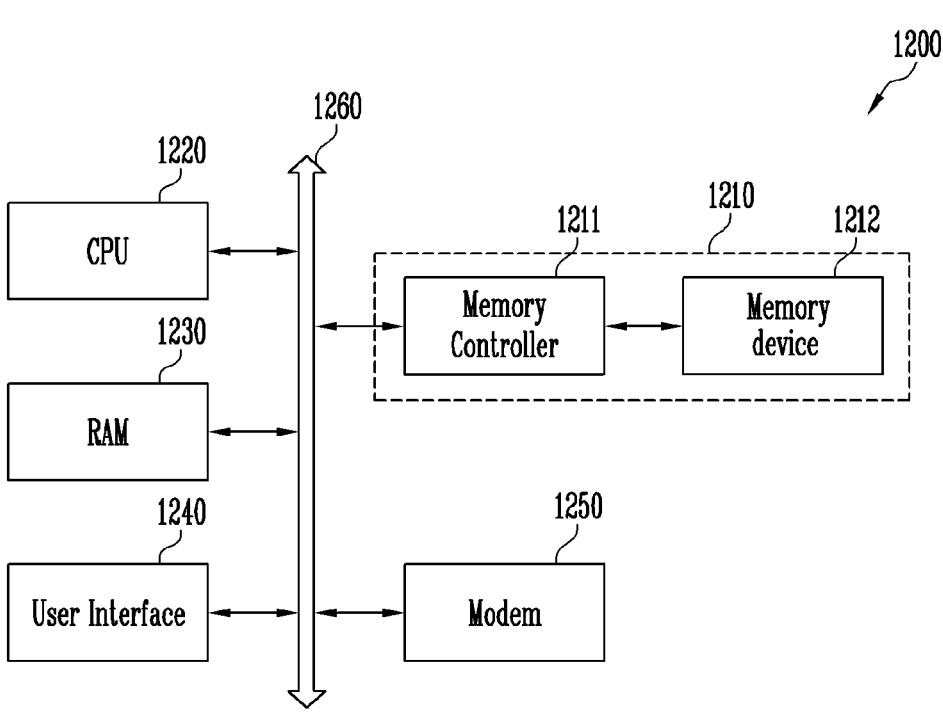
FIG. 7 is a block diagram, illustrating a configuration of a computing system, according to an embodiment of the present disclosure.

FIG. 7 is a block diagram illustrating a configuration of a computing system according to an embodiment of the present disclosure.

Referring to FIG. 7, the computing system 1200 may include a CPU 1220, a random access memory (RAM) 1230, a user interface 1240, a modem 1250, and a memory system 1210, which are electrically connected to a system bus 1260. In addition, when the computing system 1200 is a mobile device, a battery for supplying an operation voltage to the computing system 1200 may be further included, and an application chipset, a camera image processor (CIP), a mobile DRAM, and the like may be further included.

The memory system 1210 may be configured of a memory device 1212 and a memory controller 1211 similar to those described with reference to FIG. 6.

What is claimed is:

1. A method of manufacturing a semiconductor device, the method comprising:

forming a preliminary source structure including a lower source layer, a first source protective layer, a source sacrificial layer, a second source protective layer and an upper source layer;

forming a stack structure including first material layers and second material layers, the first material layers and the second material layers alternately stacked over the preliminary source structure, forming a hole passing through the stack structure and the preliminary source structure;

forming a preliminary memory layer on a surface of the hole;

forming a channel layer on the preliminary memory layer;

forming a trench passing through the stack structure and the upper source layer;

forming a first buffer pattern and second buffer patterns by performing a surface treatment on a side portion of the upper source layer and side portions of the second material layers exposed by the trench, wherein a portion of the upper source layer remains between the first buffer pattern and the preliminary memory layer, and wherein portions of the second material layers remain between the second buffer patterns and the preliminary memory layer;

forming a preliminary buffer layer covering the first buffer pattern, the first material layers and the second buffer patterns;

removing a portion of the second source protective layer exposed by the trench;

forming a buffer layer covering the first buffer pattern, the first material layers and the second buffer patterns by performing an oxidation process of the preliminary buffer layer, wherein a dummy pattern is formed by oxidizing a portion of the source sacrificial layer;

removing a portion of the dummy pattern to expose a remaining portion of the source sacrificial layer;

forming a cavity exposing a portion of the preliminary memory layer by removing the source sacrificial layer and the first and second source protective layers;

forming an expanded cavity exposing a portion of the channel layer by removing the portion of the preliminary memory layer; and forming a source layer in the expanded cavity.

2. The method of claim 1, wherein the source sacrificial layer includes nitride.

3. The method of claim 1, wherein the surface treatment is an oxidation process.

4. The method of claim 1, wherein the first buffer pattern, the second buffer patterns, the dummy pattern, the first source protective layer and the second source protective layer include oxide, and the first buffer pattern, the second buffer patterns and the dummy pattern are removed while removing the first and second protective layers and the portion of the preliminary memory layer.

5. The method of claim 4, further comprising:

replacing the second material layers with conductive patterns through the trench after forming the source layer in the expanded cavity.

* * * * *